US006636978B1

United States Patent
Kirihata et al.

(10) Patent No.: US 6,636,978 B1
(45) Date of Patent: Oct. 21, 2003

(54) RESCHEDULING DATA INPUT AND OUTPUT COMMANDS FOR BUS SYNCHRONIZATION BY USING DIGITAL LATENCY SHIFT DETECTION

(75) Inventors: Toshiaki Kirihata, Poughkeepsie, NY (US); L. Brian Ji, Fishkill, NY (US); John Ross, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/441,798

(22) Filed: Nov. 17, 1999

(51) Int. Cl.$^7$ .................................................. H04L 7/00
(52) U.S. Cl. ....................................................... 713/400
(58) Field of Search ................................... 713/400, 503

(56) References Cited

U.S. PATENT DOCUMENTS

| | | | | |
|---|---|---|---|---|
| 4,873,491 A | * | 10/1989 | Wilkins | 327/280 |
| 5,272,730 A | * | 12/1993 | Clark | 375/376 |
| 5,550,829 A | * | 8/1996 | Wang | 370/311 |
| 5,568,437 A | * | 10/1996 | Jamal | 365/201 |
| 5,600,682 A | * | 2/1997 | Lee | 375/354 |
| 5,917,760 A | * | 6/1999 | Millar | 365/194 |
| 6,031,788 A | * | 2/2000 | Bando et al. | 365/233 |
| 6,088,774 A | * | 7/2000 | Gillingham | 711/167 |
| 6,226,757 B1 | * | 5/2001 | Ware et al. | 713/503 |
| 6,236,343 B1 | * | 5/2001 | Patapoutian | 341/111 |
| 6,442,644 B1 | * | 8/2002 | Gustavson et al. | 711/105 |

FOREIGN PATENT DOCUMENTS

EP          540119 A2 *  5/1993  ........... H03L/7/189

* cited by examiner

*Primary Examiner*—Thomas Lee
*Assistant Examiner*—Eric Chang
(74) *Attorney, Agent, or Firm*—H. Daniel Schnurmann

(57) ABSTRACT

Digital latency shift communication problems from a driver chip to a receiver chip are overcome by scheduling a data output latency, a data input latency, a data output command, and/or a data output command, such that data outputted by the driver chip is received by the receiver chip at the correct time. A digital shift detection circuit detects the offset of the actual latencies from predetermined latencies. The offset of the latency is fed back to the scheduling circuit to override the predetermined latencies and/or command inputs that control the chip. The offset can be directly back-fed to the chip driver or chip receiver to compensate for digital shifts. Digital shift detection is achieved by measuring actual latencies with a manufacturing stand-alone tester, or with a built-in tester integral to the system. The digital shift detection predicts the conditions that create a digital shift by way of a mathematical model.

12 Claims, 25 Drawing Sheets

RESCHEDULING DATA INPUT AND OUTPUT COMMANDS FOR BUS SYNCHRONIZATION BY USING DIGITAL LATENCY SHIFT DETECTION

FIELD OF THE INVENTION

This invention is generally related to inter-chip communication, and more particularly, to a communication protocol employed for rescheduling purposes to achieve communication at any frequency.

BACKGROUND OF THE INVENTION

The evolution of sub-micron CMOS technology has steadily improved the performance of microprocessors. Quadrupling every three years, it has prompted the development of product chips having clock frequencies exceeding 500 MHz, even attaining, at least on an experimental basis, clock frequencies of the order of 1 GHz. It is highly desirable to have memories, such as Dynamic Random Access Memories (DRAM), characterized not only by their high density but also by their high performance. Synchronous DRAMs (SDRAMs) typically use a 3-stage pipelined architecture and a 2-bit pre-fetch architecture for a consecutive column burst operation provided with an internal burst address counter, improving the data rate to 125 Mb/sec per pin for prior generation 16 Mb memories. Thereafter, 64 Mb SDRAMs introduced an address incremented pipeline scheme, increasing the data rate to 150 Mb/sec per pin. Still after, 256 Mb SDRAMs resorted to a wave-pipeline scheme with first-in first-out (FIFO) circuitry, boosting the data rate to approximately 250 Mb/sec per pin. Taking a more drastic step, the 72 Mb RAM bus DRAM (RDRAM) employing an 8-bit pre-fetch and a protocol based design provided with RAM Bus-Signalling-Level (RSL) interfaces, achieve frequencies as high as 800 Mb/sec per pin×16 DQs, resulting in 1.6 Gb/sec.

As the speed of memories improves, it is particularly important to optimize the communication between the microprocessor and the memory. FIG. 1a shows a conventional system (100) that establishes communication between a driver chip (110) and a receiver chip (120). When operating in a memory read access mode, the driver chip (110) is the memory and the receiver chip (120) is the microprocessor. When operating in a memory write access mode, the driver chip (110) is the microprocessor and the receiver chip (120) is the memory. Practitioners will fully realize that when implementing an actual system, a controller is required to establish data communication between the chip (130), the driver chip (110) and the receiver chip (120).

The detailed operation of the system (100) is explained with reference to the timing diagram shown in FIG. 1b. For simplicity sake, the discussion that follows assumes a single data rate of communication synchronized to a reference clock ($CLK_{REF}$). However, the inventive method to be described hereinafter is not limited to the configuration shown, but it also applies to a double data rate communication with or without source synchronization. The driver chip (110) outputs data in synchronism with $CLK_{REF}$ on the data bus (DQ) following an output latency ($LAT_{OUT}$), which is measured from the time an output event command is recognized. More particularly, the output event is recognized when an output command signal ($CMD_{OUT}$) is at 0 at the leading edge of a reference clock ($CLK_{REF}$). The data is outputted to the data bus (DQ) driven by clock $CLK_{REF}$ after a lapse of a predetermined number of clock cycles. This is defined as the output latency ($LAT_{OUT}$). The receiver chip (120) receives data from the data bus (DQ) after a lapse of the input latency ($LAT_{IN}$), which is defined as the number of clock cycles after an event command is recognized. More particularly, the input event is recognized when an input command signal ($CMD_{IN}$) is at 0 at the leading edge of $CLK_{REF}$. Input data is received from the data bus (DQ) in synchronism with $CLK_{REF}$ following a number of clocks cycles. This number is defined as the input latency ($LAT_{IN}$). The control chip (130) predetermines the output latency $LAT_{OUT}$ as well as the input latency $LAT_{IN}$ applicable to the driver chip (110) and the receiver chip (120) by following $LAT_{IN}$ and $LAT_{OUT}$ rules. The control chip (130) schedules the output command ($CMD_{OUT}$) and the input command ($CMD_{IN}$) to successfully establish communication between the driver chip (110) to the receiver chip (120). In an actual system, the control chip (130) is the memory controller. Scheduling data between $LAT_{OUT}$, $LAT_{IN}$, $CMD_{IN}$, and $CMD_{OUT}$ follows certain rules of communication in synchronism with $CLK_{REF}$, which are applicable to the transfer of data from the driver chip (110) to the receiver chip (120) via the data bus (DQ). By way of example, and still referring to the same timing diagram, the scheduling of $CMD_{OUT}$ and $CMD_{IN}$ is shown for $LAT_{OUT}=2$ and $LAT_{IN}=1.5$. Note that the output data from driver chip (110) is available at a time when the data input event for the receiver chip (120) is enabled, resulting in a successful data communication. As the chip-to-chip communication frequency increases, synchronization with the reference clock ($CLK_{REF}$) becomes more difficult to achieve since the internal operation of the system is usually referenced by the same reference clock $CLK_{REF}$.

FIG. 2 illustrates a first example showing a synchronization error ($t_{err}$) applicable to the driver chip (110). The following example assumes an output latency $LAT_{OUT}$ of 1, although $LAT_{OUT}$ may take any value. Internal output event control signal ($CTRL_{OUT}$) switches to 1 when the output event is recognized (i.e., when $CMD_{OUT}$ is detected at the leading edge of the $CLK_{REF}$). The presence of detection logic delays the actual recognition by an amount of time $t_1$. The output event is enabled by detecting the leading edge of $CLK_{INT}$ when $CTRL_{OUT}$ is at 1. The actual output is valid even after $t_2$ as a result of the presence of the output logic. The internal event recognition and the output logic delays $t_1$ and $t_2$ cause the actual output to introduce a synchronization error $t_{err}$ with respect to $CLK_{REF}$. To avoid the problem of $t_{err}$ shown in FIG. 2, a DLL (Delayed Locked Loop) has often been advantageously used to create a compensated internal clock version which leads the reference clock ($CLK_{REF}$) by a negative time delay $t_2$.

Still referring to driver chip (110) and with reference to FIG. 3, an example that uses the aforementioned DLL compensation shows an output being synchronized to the reference clock ($CLK_{REF}$). Let it be assumed that the system output is enabled by the leading clock ($CLK_{INT}$) which compensates for the error $t_2$ when using DLL compensation. Because of this negative $CLK_{INT}$ compensation by $t_2$ of $CLK_{REF}$, after a time delay $t_2$, the output successfully synchronizes to the reference clock ($CLK_{REF}$). This DLL compensation works well at low frequencies (<200 Mhz). However, as the clock frequency increases, a problem with the digital shift surfaces when $CLK_{INT}$ compensates for the lapse of $t_2$ occurring prior to the output event recognition, causing a digital latency shift condition. FIG. 4 illustrates the problem which causes a digital latency shift. The output recognition event defined by the leading edge of the $CTRL_{OUT}$ occurs at a time subsequent to the target leading edge of $CLK_{INT}$. Thus, the driver chip detects the next leading edge of the target leading edge of $CLK_{INT}$. As a result, the output occurs exactly one clock cycle later than the target. This causes a digital latency shift or offset between the predetermined latency ($LAT_{OUT}$) and the actual latency ($ALAT_{OUT}$) Mathematically, a digital shift occurs when $t_1+t_2>=T_{REF}$, where $T_{REF}$ represents the $CLK_{REF}$ cycle time, as shown. Thus, the digital shift is cycle-time dependent, the cycle-time of the first digital shift occurring when $T_{REF}=(t_1+t_2)$. Multiple cycles of n digital shifts occur when $t_1+t_2>=nT_{REF}$, wherein n is an integer greater than or equal to 1 representing the number of digital shifts. Thus, n=1 results in a single digital shift, as described above. This problem causes multiple digital shifts for the predetermined latency ($LAT_{OUT}$) command when an output event is scheduled to occur at a predetermined latency following the command. The output command ($CMD_{OUT}$) is synchronized to the reference clock ($CLK_{REF}$), but the internal output event control signal ($CTRL_{OUT}$) must be synchronized to the compensated clock ($CLK_{INT}$). FIG. 5 illustrates an occurrence when there is no digital shift for the predetermined latency ($LAT_{OUT}$) of 3. Note that the example counts the number of clock cycles 1 of 3 for $LAT_{OUT}$=f 3, unlike previous examples. FIG. 6 illustrates an instance of a 2 cycle digital shift ($t_{err}=2$) for the predetermined latency ($LAT_{OUT}$) of 3. The actual latency ($ALAT_{OUT}$) is now equal to 5 because of the digital shift ($t_{err}=2$). If the actual latency ($ALAT_{OUT}$) is different from the predetermined latency ($LAT_{OUT}$), the driver chip (110) and the receiver chip (120) will not communicate successfully. A similar problem exists for a digital shift or multiple digital clock shifts for the receiver chip (120) when the DLL compensation for the internal clock ($CLK_{INT}$) is applied to synchronize the data input with the reference clock ($CLK_{REF}$).

FIG. 7a illustrates the problem of communication at the system level in synchronism with $CLK_{REF}$, when a digital shift occurs in the driver chip (110) and the receiver chip (120). System (100) consists of a driver chip (110), a receiver chip (120) and a control chip (130). The goal is to successfully exchange data between the driver chip (110) and the receiving chip (120) at a system level, exactly the same as was shown in FIG. 1. The following discussion assumes for simplicity sake a single data rate communication without resorting to source synchronization. However, the invention to be discussed hereinafter is not limited to this configuration but is also applicable to a double data rate communication with and without source synchronization. Referring to FIG. 7b, let it be assumed that the output latency ($LAT_{OUT}$) and the input latency ($LAT_{IN}$) predetermined by control chip (130) are 2.0 and 1.5, respectively, for the driver chip (110) and the receiver chip (120). It is also assumed that driver chip (110) causes a digital shift by one clock, although the receiver chip (120) does not cause a digital shift. The actual latency ($ALAT_{OUT}$) for driver chip (110) is therefore 3.0, and the actual latency ($ALAT_{IN}$) for the receiver chip (120) is same as the $LAT_{IN}$, i.e., 1.5. The driver chip (110) outputs data to the data bus (DQ) once $ALAT_{OUT}=3$, which is measured from the time at which an output event command is recognized. More particularly, the output event is recognized when an output command signal ($CMD_{OUT}$) is at low at the leading edge of the reference clock ($CLK_{REF}$). The output data is driven to the data bus (DQ) while synchronization with $CLK_{REF}$ is achieved once the actual output latency $ALAT_{OUT}=3$. The receiver chip (120) receives data on the data bus (DQ) after $LAT_{IN}=1.5$ measured from the time at which an event command is recognized. More particularly, the input event is recognized when input command signal ($CMD_{IN}$) is at 0 at the leading edge of the $CLK_{REF}$. The input data is received from the data bus (DQ) while synchronization with $CLK_{REF}$ has been established after 1.5 clocks, to become the input latency ($LAT_{IN}$). The control chip (130) schedules the output command ($CMD_{OUT}$) and the input command ($CMD_{IN}$), assuming a predefined $LAT_{OUT}$ of 1 out of 2.0 and $LAT_{IN}$ of 1 out of 1.5. In an actual system, the control chip (130) is the memory controller. This causes a failure in communication because the data has not yet been outputted by the driver chip (110) at a time when the data is received by the receiver chip (120). This failure is due to a digital shift occurring in the driver chip (110). A similar problem is encountered if it is the receiver chip which causes a digital shift. Accordingly, there is a strong requirement to overcome all the digital shift problems not only at the chip level which includes driver chips, receiver chips, and the like, but also at the system level in order to achieve good communication even at high frequencies.

OBJECTS OF THE INVENTION

Accordingly, it is an object of the invention to achieve chip-to-chip communication using a rescheduling scheme to overcome a digital latency shift problem.

It is another object of the invention to provide a digital latency control method which automatically detects a digital problem, and reschedules at least one predetermined latency command either for a driver chip or for a receiver chip.

It is still another object of the invention to provide a circuit and a method for detecting a digital latency shift as part of the aforementioned rescheduling scheme.

It is another object of the invention to provide a circuit and a method for detecting any number of digital latency shifts at any frequency.

SUMMARY OF THE INVENTION

In a one aspect of the present invention, there is provided an electric system including: a driving circuit for outputting data to a bus, the driving circuit being responsive to a prescheduled data output command and to a predetermined data output latency; a receiving circuit for receiving the data from the bus, the receiving circuit being responsive to a prescheduled data input command and to a predetermined data input latency; and a scheduling circuit for rescheduling at least one of the prescheduled data output commands and the predetermined data output latency, one of the prescheduled data input commands and the predetermined data input latency, wherein the driving circuit and the receiving circuit are timed to communicate data correctly. A number of the digital latency shift can be automatically detected by a simple on-chip digital shift detection scheme. Optionally, the digital latency shift can be detected by an off-chip tester for the rescheduling scheme.

BRIEF DESCRIPTION OF THE DRAWINGS

The foregoing and other objects, aspects and advantages will be better understood from the following detailed description of a preferred embodiment of the invention when taken in conjunction with the accompanying drawings, in which:

FIG. 1b is a timing diagram used to define the concept of latency applicable to the system of FIG. 1a;

FIG. 2 is a timing diagram showing an example of a synchronization error ($t_{err}$) applicable to the driver chip of FIG. 1a;

FIG. 3 is a timing diagram showing an example of synchronizing an output to the reference clock ($CLK_{REF}$), applicable to the driver chip shown in FIG. 1a;

FIG. 7 shows an example of a system level communication problem when a digital shift occurs in the driver chip and the receiver chip of FIG. 1a;

DETAILED DESCRIPTION OF THE INVENTION

Figure 8:
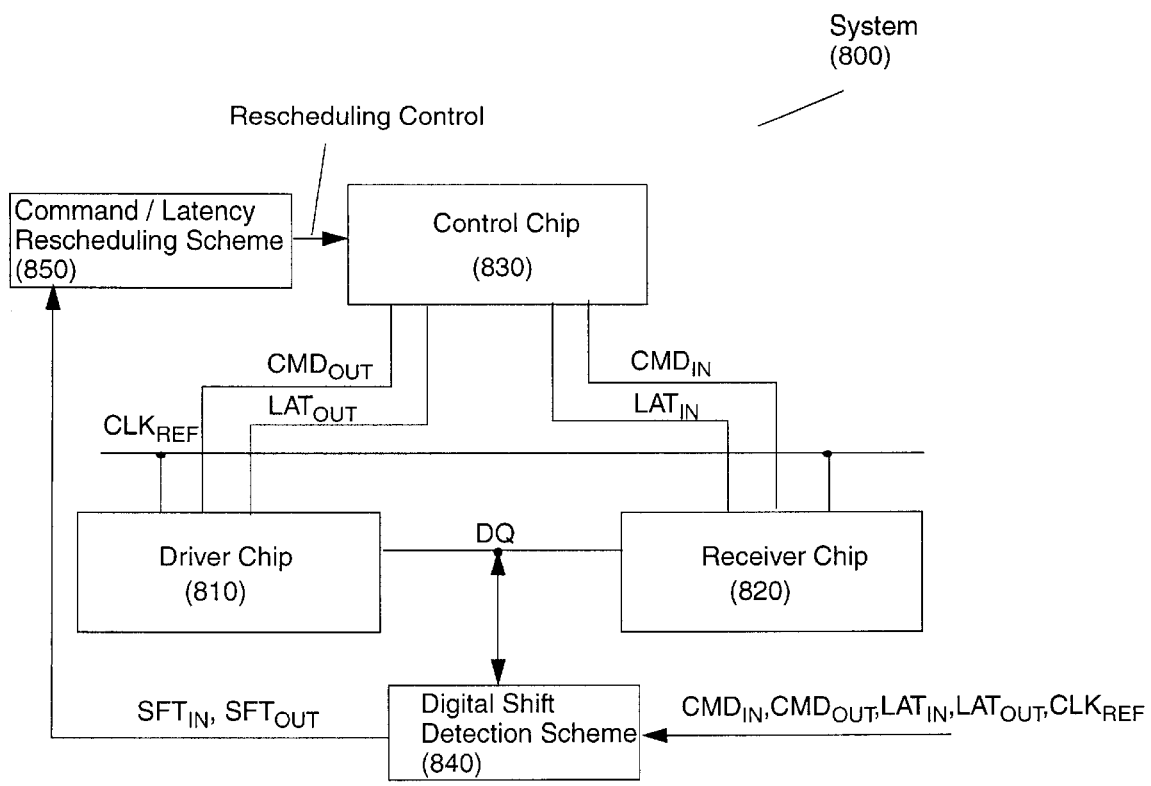
FIG. 8 shows a system consisting of a driver chip, a receiver chip and a control chip coupled to a command/latency rescheduling circuit and to a digital shift detection circuit, in accordance with a first embodiment of the invention.

FIG. 8 shows a system (800) consisting of a driver chip (810), a receiver chip (820), a control chip (830), for a predetermined latency ($LAT_{OUT}$) of 3. The driver chip (810) and the receiver chip (820) are coupled to the data bus (DQ) to establish data communication between (810) and (820). In order to overcome a communication failure due to digital shifts in the driver chip (810) and the receiver chip (820), the system (800) additionally includes a digital shift detection circuit (840) and a command/latency rescheduling circuit (850). The following discussions assumes, for simplicity sake, a single data rate communication without source synchronization. However, the invention is not limited to this configuration, and is equally applicable to double data rate communication with or without source synchronization. It is assumed that the output latency ($LAT_{OUT}$) and the input latency ($LAT_{IN}$) predetermined by the control chip (830) are 2.0 and 1.5 for the driver chip (810) and receiver chip (820), respectively. Unlike the previous example, $LAT_{OUT}$ and $LAT_{IN}$ can be changed by the command/latency rescheduling circuit (850). Similarly, the data output command ($CMD_{OUT}$) for the driver chip (810) and the input command ($CMD_{IN}$) for the receiver chip (820) can, likewise, also be rescheduled by the command/latency rescheduling circuit (850). The following discussion assumes that the driver chip (810) causes a digital shift by one clock ($SFT_{OUT}$=1), whereas the receiver chip (820) causes no digital shift ($SFT_{IN}$=0) altogether. The digital latency detection circuit (840) detects an event of the digital shift in the driver chip (810), the receiver chip (820), or in both. More particularly, the digital latency detection circuit (840) checks whether the actual latencies $ALAT_{OUT}$ and $ALAT_{IN}$ coincide with the predetermined latency $LAT_{OUT}$ and $LAT_{IN}$, and generates offsets $SFT_{OUT}$ (=$ALAT_{OUT}$-$LAT_{OUT}$) and $SFT_{IN}$ (=$ALAT_{IN}$-$LAT_{IN}$). Alternatively, the digital latency detection (840) predicts the digital shifts by the detected conditions by similarly observing an internal behavior of the driver and receiver chips, and also generating the offsets $SFT_{OUT}$=1 and $SFT_{IN}$=0. The command/latency rescheduling (850) changes the predetermined output latency ($LAT_{OUT}$), the predetermined input latency ($LAT_{IN}$), the time when $CMD_{OUT}$ and/or $CMD_{IN}$ are enabled to ensure that data outputted by the driver chip (810) and received by the receiver chip (820) is indeed correct. By way of example of a digital shift by 1 clock ($SFT_{OUT}$=1 and $SFT_{IN}$=0), several solutions for rescheduling are possible. These will be discussed hereinafter.

Figure 9A:
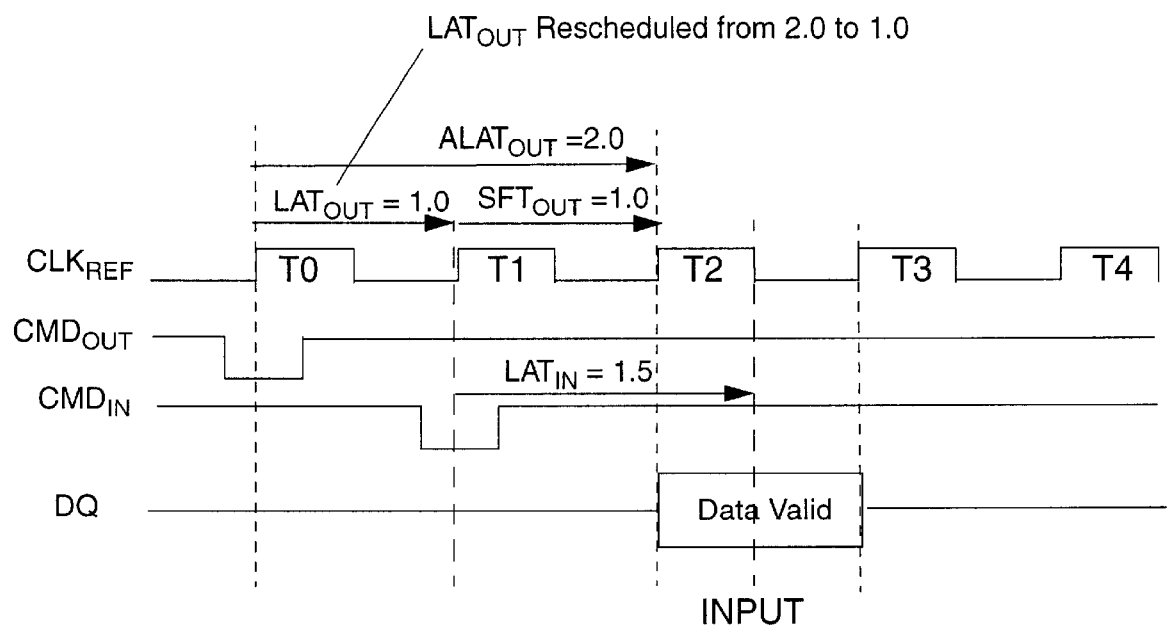
FIGS. 9a–9d are various timing diagrams applicable to the system depicted in FIG. 8 to embody the rescheduling scheme.
Figure 9B:
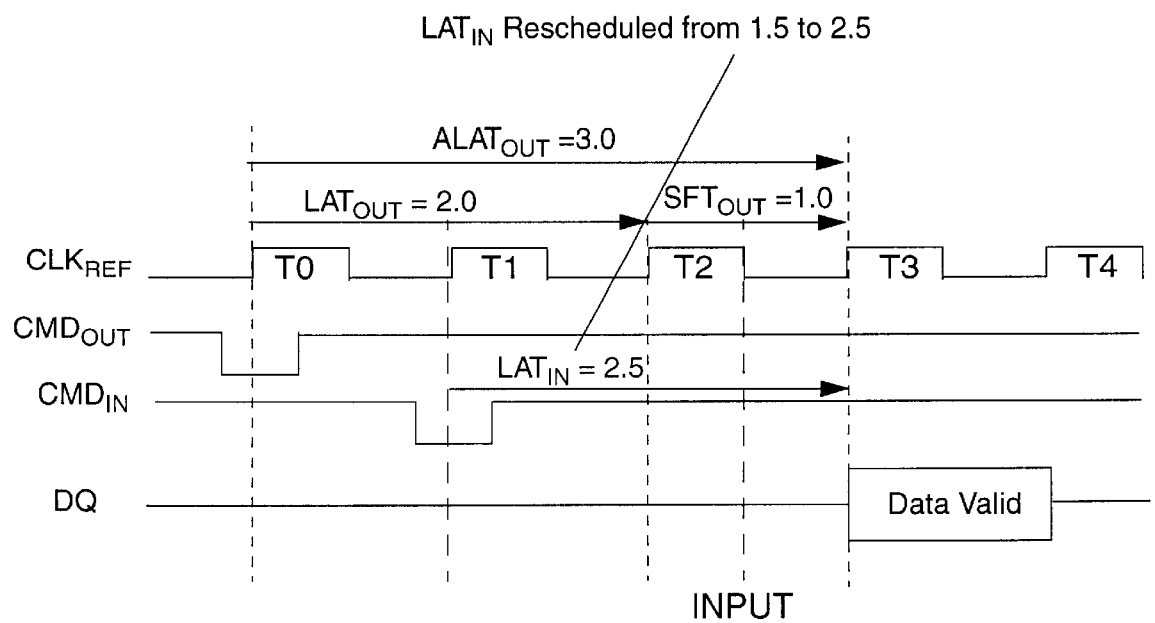
Figure 9C:
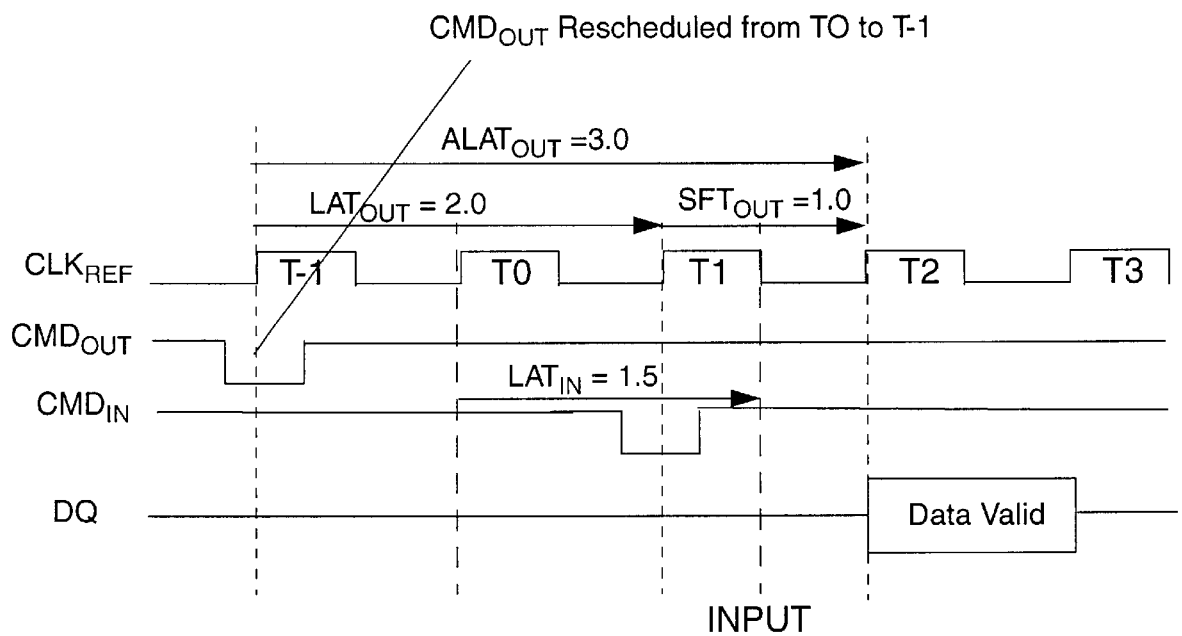
Figure 9D:
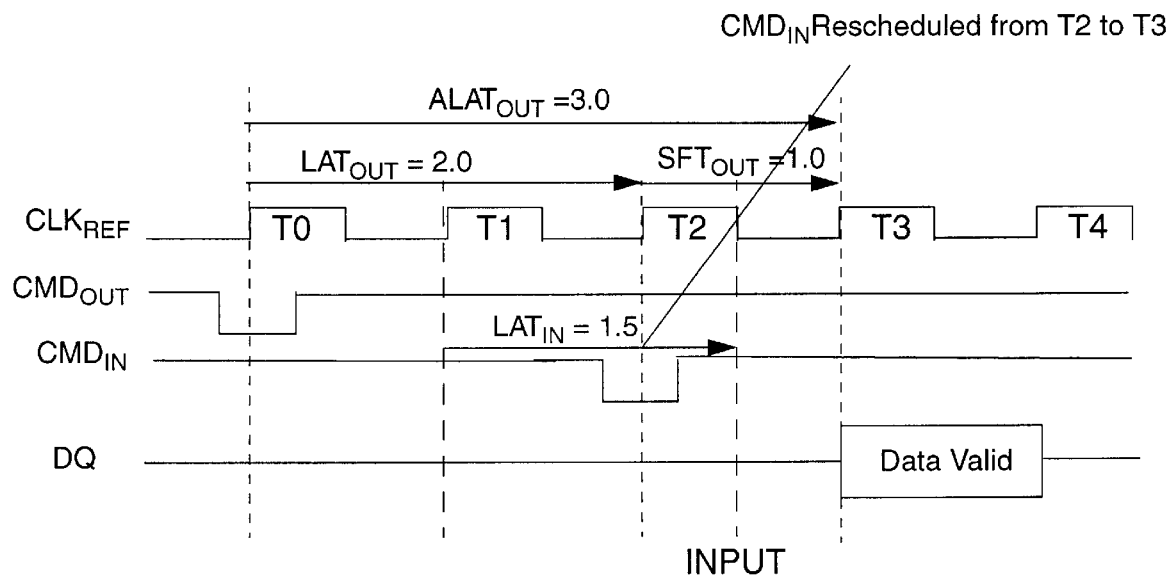

FIGS. 9a–9d show various timing diagrams for the rescheduling realized by the command/latency rescheduling in the instance where the condition $SFT_{OUT}$=1 and $SFT_{IN}$=0 is detected by the digital shift detection (840). FIG. 9a reschedules the output latency ($LAT_{OUT}$) for $SFT_{OUT}$, resulting in a modification of $LAT_{OUT}$ from the predetermined number of 2 to 1. This forces $ALAT_{OUT}$=2 after subtracting $SFT_{OUT}$=1, which enables communication with the receiver chip (920). FIG. 9b reschedules the input latency ($LAT_{IN}$) by adding $SFT_{OUT}$=1, resulting in an adjustment of $LAT_{IN}$ from the predetermined number of 1.5 to 2.5. Successful communication is now possible because the receiver chip (820) simulates the digital shift ($SFT_{OUT}$=1) caused by the driver chip (810). FIG. 9c reschedules the time when $CMD_{OUT}$ is enabled 1 clock cycle earlier than the predetermined $CMD_{OUT}$ phase. This allows matching the time when the receiver receives data having a digital latency shift of 1 clock cycle due to the driver chip (810), overcoming the communication problem. FIG. 9d reschedules the time when $CMD_{IN}$ is enabled 1 cycle later than the predetermined $CMD_{IN}$ phase. Again, this matches the time when the receiver receives data with a digital latency shift of 1 clock cycle due to the driver chip (810), overcoming the communication problem. FIG. 8 assumes that the latency/command rescheduling forces control chip (830) to reschedule $LAT_{OUT}$, $LAT_{IN}$, $CMD_{OUT}$, and/or $CMD_{IN}$. A similar rescheduling can be performed by directly controlling the driver chip (810) or the receiver chip (820) by integrating the command/latency rescheduling within the driver chip (810) or within the receiver chip (820). Optionally, the rescheduling may also include an analog time adjustment to satisfy the setup and hold times for $CMD_{OUT}$, $CMD_{IN}$, and of the data with respect to $CLK_{REF}$. Note that $CMD_{OUT}$, $CMD_{IN}$, $LAT_{OUT}$, $LAT_{IN}$ are rescheduled digitally with respect to $CLK_{REF}$.

Figure 10A:
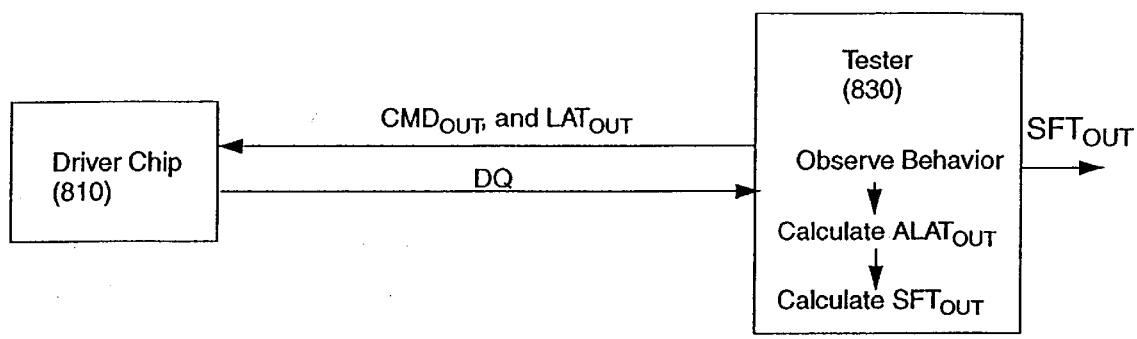
FIGS. 10a–10b are two block diagrams showing details of the digital latency shift detection for the driver chip shown in FIG. 8 used to detect the digital shift ($SFT_{OUT}$) by way of an on-chip or off-chip tester.
Figure 10B:
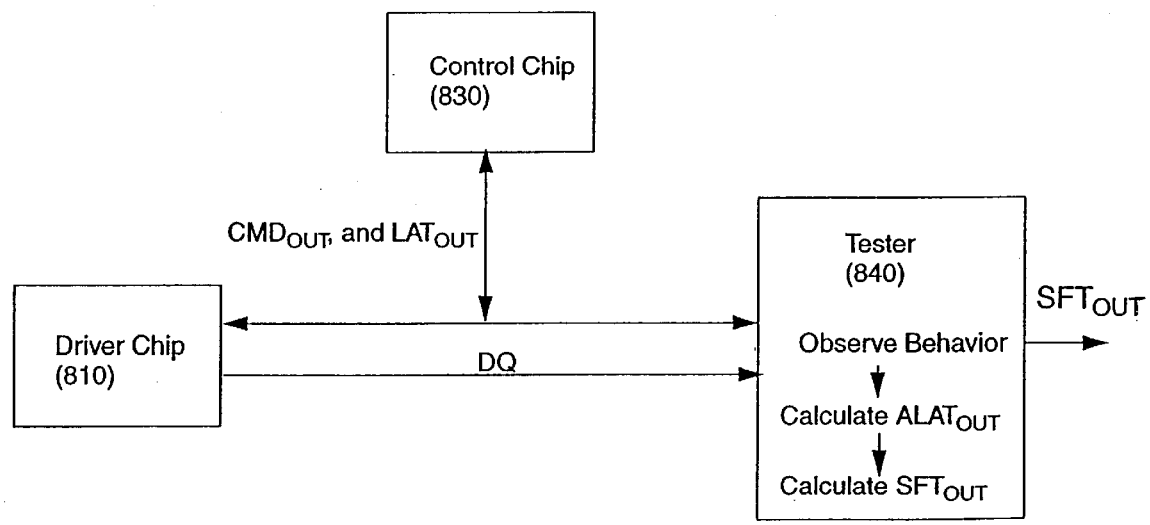

FIGS. 10a–10b show the details of the digital latency shift detection for the driver chip (840), which detects the digital shift ($SFT_{OUT}$) directly by using an on-chip or an off-chip tester (1150). Likewise, the concept of the detection scheme (840) is equally applicable for detecting digital shifts in the receiver chip. The first example, shown in FIG. 10a, assumes that the tester (840) controls both the output command ($CMD_{OUT}$) and the output latency ($LAT_{OUT}$) to the driver chip (810), and also measures the actual latency ($ALAT_{OUT}$). The second example, shown in FIG. 10b, assumes that the tester (840) observes $CMD_{OUT}$, as well as $LAT_{OUT}$ generated by the control chip (830) and, further, also measures the actual latency ($ALAT_{OUT}$). Regardless of the first and second examples, by analyzing the offset between $LAT_{OUT}$ and the actual latency ($ALAT_{OUT}$), the tester outputs the results of the digital latency offset ($SFT_{OUT}$). By way of example, if $LAT_{OUT}=ALAT_{OUT}$, the output of $SFT_{OUT}=0$. If $LAT_{OUT}<ALAT_{OUT}$ by 1 clock, the output of $SFT_{OUT}=1$. The digital shift detection is preferably enabled after system power-on and/or after the $CLK_{REF}$ frequency changes. Optionally, when the chip frequency is predetermined for a fixed frequency, the digital shift condition is detected during the manufacturing phase. In this case, $SFT_{OUT}$ is stored in fuses or in some other type of non-volatile memory to compensate for the digital latency shift with a latency/command rescheduling taking place at the system level. When the tester is integrated within the driver chip or within the receiver chip, the tester is, preferably, a Built-in Self Tester (BIST) for detecting digital shift events.

Figure 11:
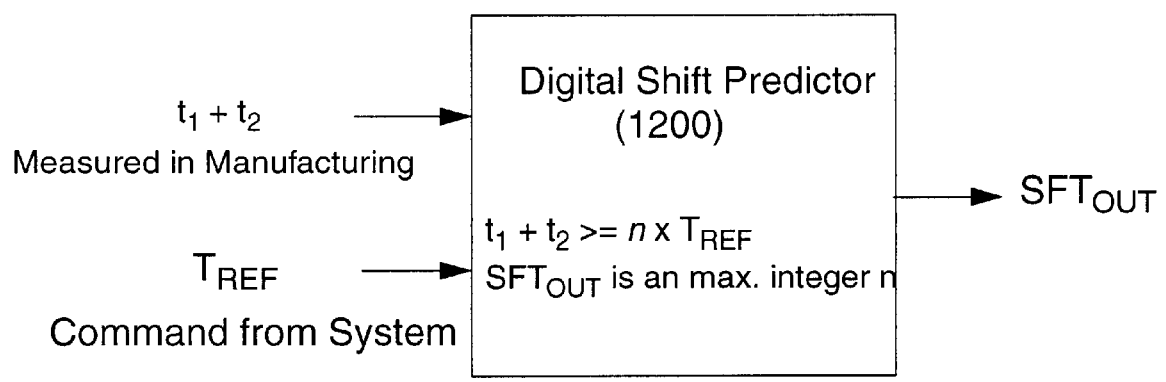
FIG. 11 is a block diagram showing details of the digital latency shift detection for predicting a digital shift.

FIG. 11 shows details of the digital latency shift detection when predicting a digital shift while analyzing the conditions of a digital shift. Although the concept will be explained hereinafter for the driver chip digital latency shift detection, it applies equally well to the receiver chip digital latency shift condition. As discussed in the Background of the Invention, the number of the digital shifts is determined by the finite delay time ($t_1+t_2$) at some internal chip and by the clock cycle time ($T_{REF}$). The finite delay time ($t_1+t_2$) can be measured during manufacturing. Thus, if the chip or system were to have a way of knowing the clock cycle time ($T_{REF}$), any digital shift can be predicted by the equation $$t_1+t_2>=nT_{REF}, \text{tm (1)}$$

wherein n is an integer greater than 1 that indicates the number of digital latency shifts. The digital shift ($SFT_{OUT}$) for the driver chip is a maximum n that meets equation (1). Preferably, $T_{REF}$ is given as a command at the system level. Additionally, by integrating BIST to measure $T_{REF}$, digital shift detection is possible without having a command input. The previous discussion is a generalized method set to overcome communication problems between a driver chip and a receiver chip, when the digital latency shifts occurs at the driver chip, receiver chip, and/or in the transmission line.

The following method discusses how to avoid a digital shift for the driver or receiver chips. More particularly, it provides a method for detecting one or more digital shifts with simple on-chip logic while tracking process, voltage and temperature variations. The detected digital number of the clocks is compensated by subtracting this number from the predetermined latency within the chip, the details of which will be discussed next with reference to the driver chip.

Figure 1A:
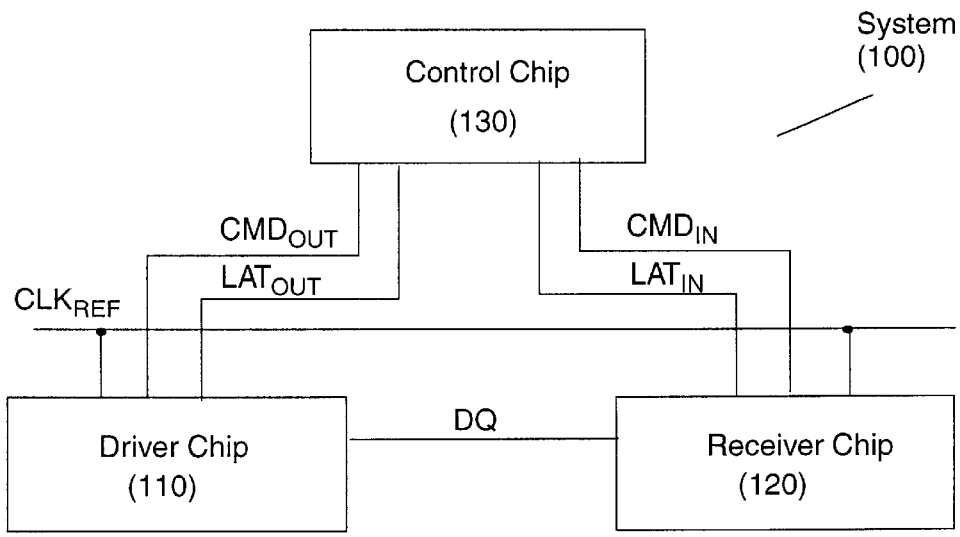
FIG. 1a is a lock diagram of a conventional system consisting of a driver chip, a receiver chip and a control chip.
Figure 1B:
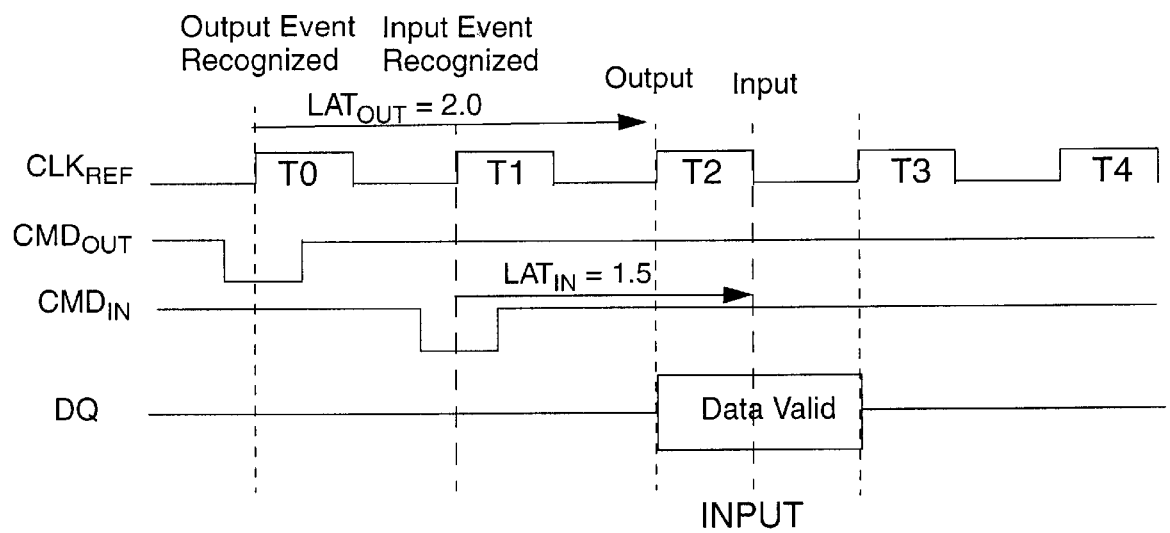
Figure 2:
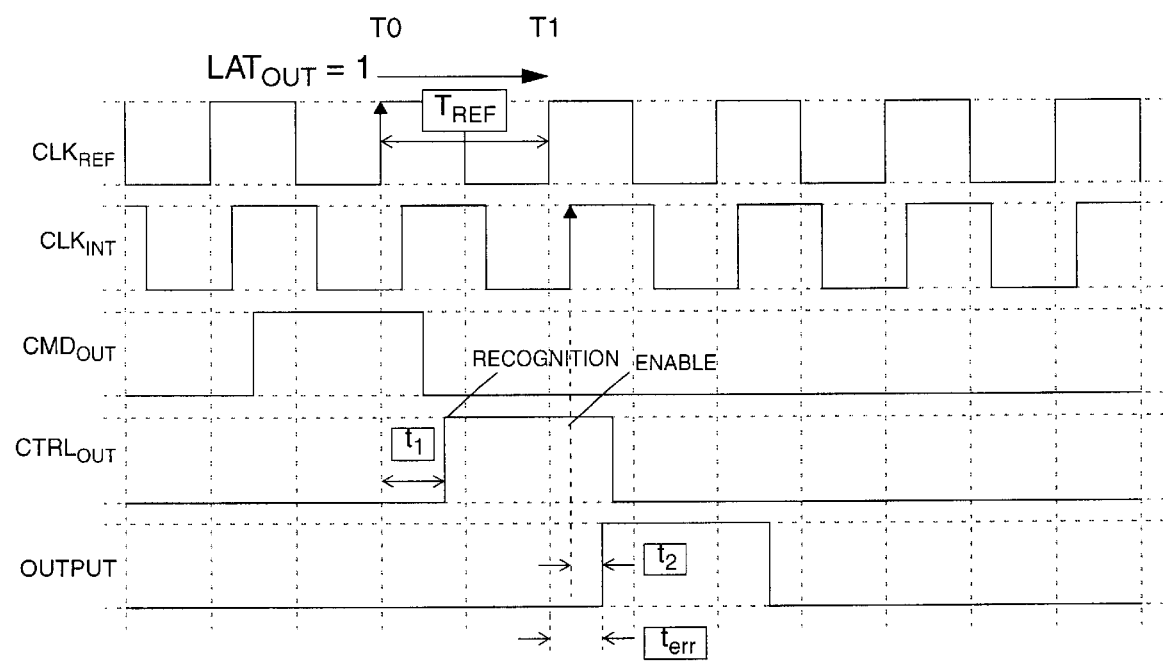
Figure 3:
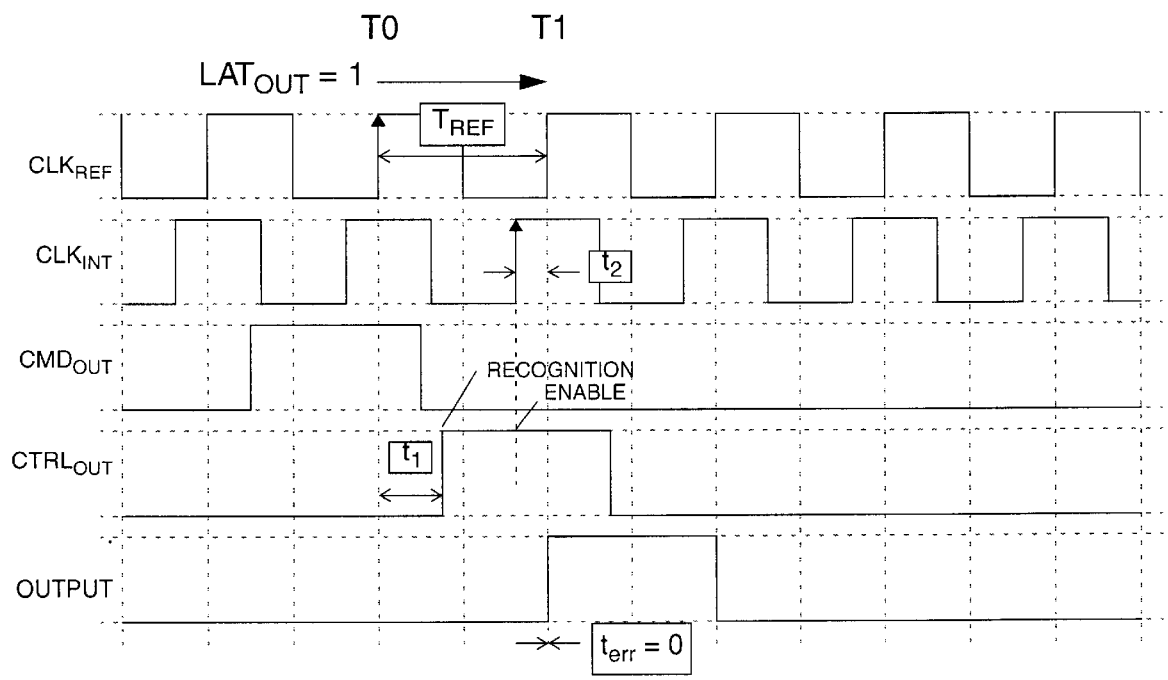
Figure 4:
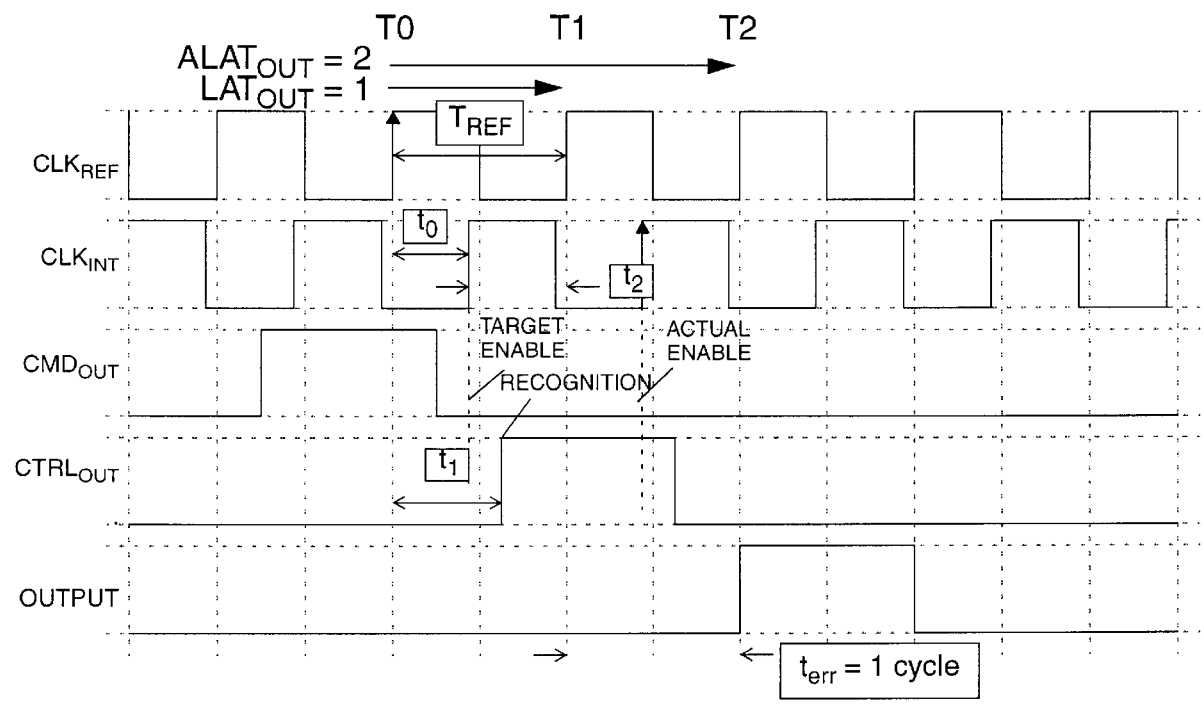
FIG. 4 is a timing diagram illustrating a problem occurring with the digital shift when $CLK_{INT}$ compensates for the lapse of delay $t_2$, occurring prior to the recognition of an output event.
Figure 5:
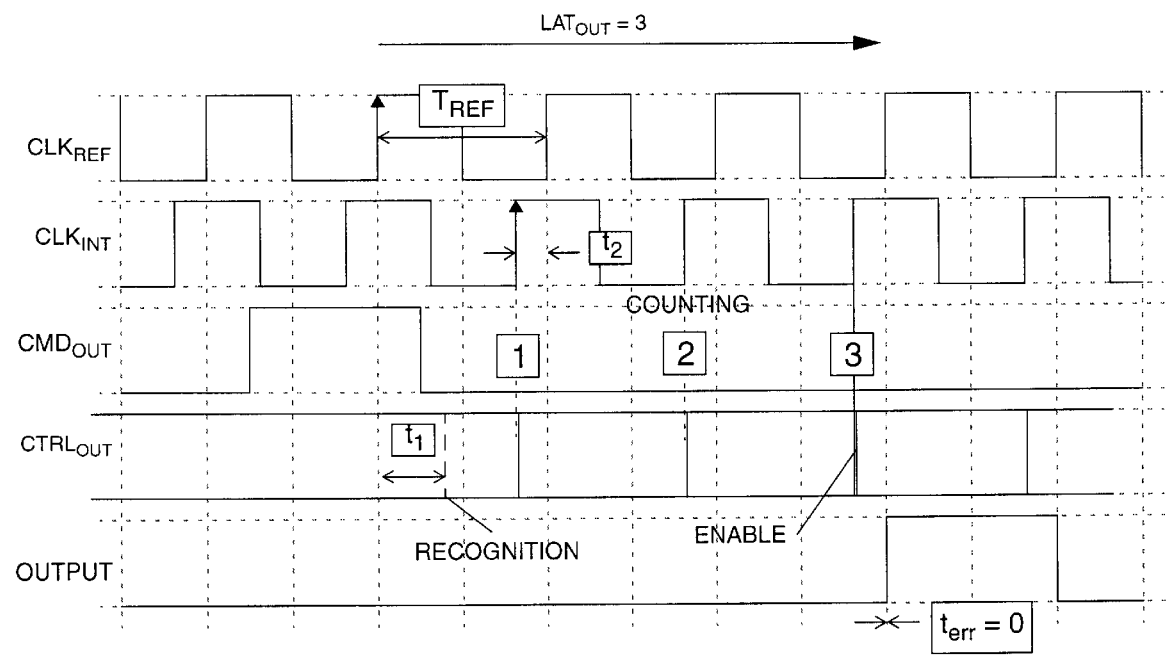
FIG. 5 is a timing diagram showing an output command ($CMD_{OUT}$) synchronized to the reference clock ($CLK_{REF}$) but where the internal output event control signal ($CTRL_{OUT}$) is synchronized to the compensated clock ($CLK_{INT}$) in the absence of a digital shift, for a predetermined latency ($LAT_{OUT}$) of 3.
Figure 6:
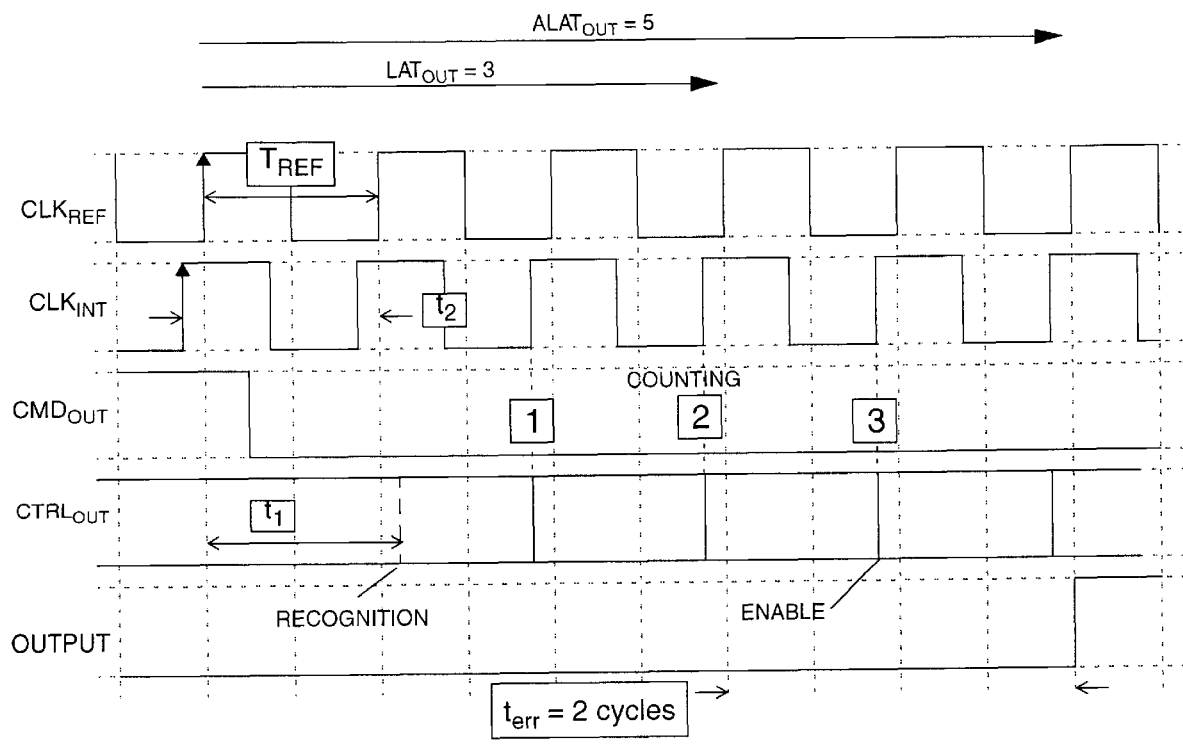
FIG. 6 illustrates an instance of a digital shift of 2 cycles ($t_{err}$=2) when the actual latency ($ALAT_{OUT}$)=5 for a predetermined latency ($LAT_{OUT}$) of 3.
Figure 7A:
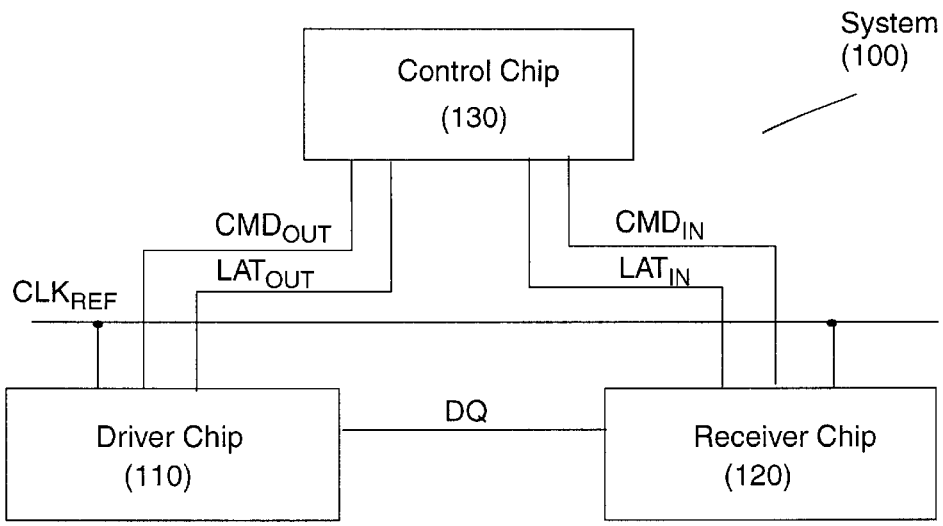
Figure 7B:
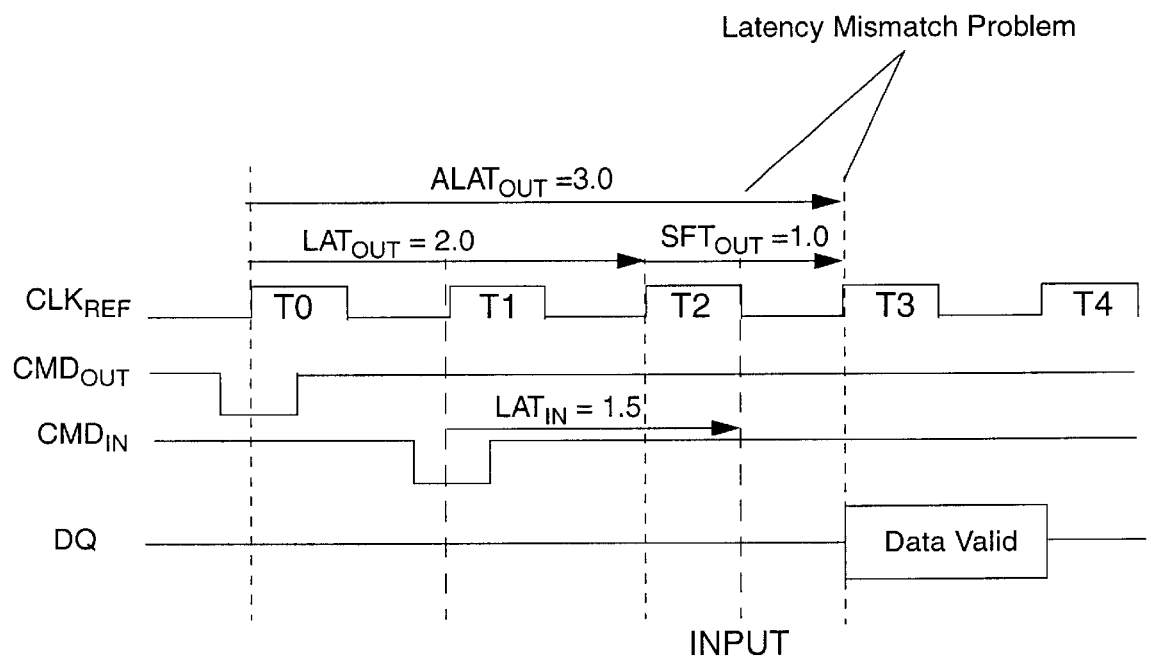
Figure 12:
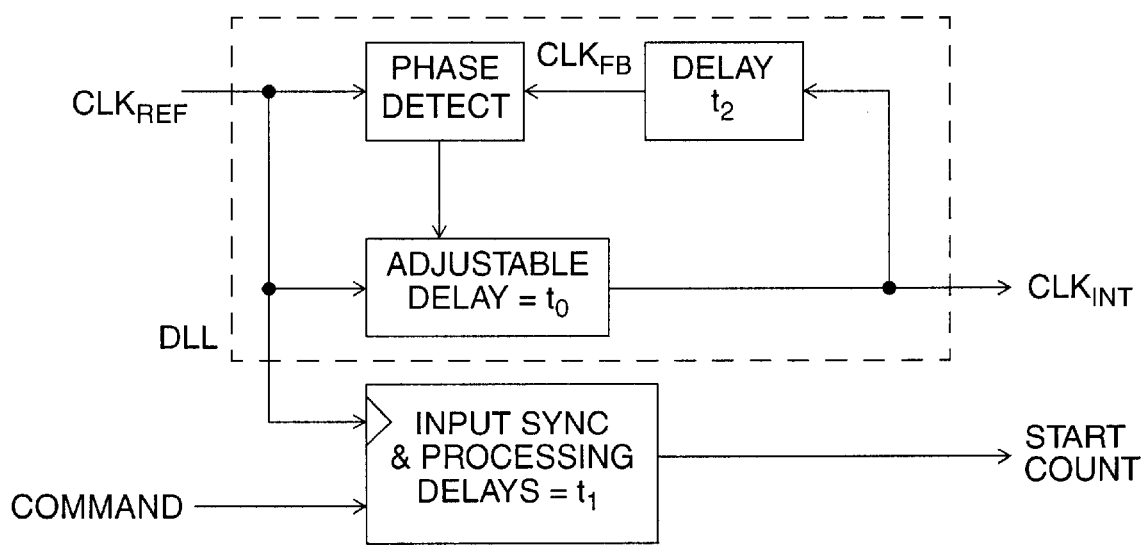
FIG. 12 is a simplified block diagram of a Delayed Locked Loop (DLL) within the driver chip.

Within the dashed box shown in FIG. 12 illustrating a simplified block diagram of a DLL within the driver chip, any DLL necessarily contains delay elements $t_0$ and $t_2$. These correspond to the same delays depicted in FIG. 3 applicable to a negative delay compensation. A phase detect circuit constantly compares the phase of $CLK_{REF}$ to the feedback clock $CLK_{FB}$, adjusting $t_0$ until they are aligned. Since $t_2$ resides within the feedback loop, $CLK_{INT}$ will lead $CLK_{REF}$ by $t_2$. The phase detector shifts the adjustable delay by $t_0$ to meet the desired phase. The phase is locked when $t_0+t_2=nT_{REF}$, wherein $T_{REF}$ is the cycle-time of $CLK_{REF}$, and n, any integer number. Also shown in FIG. 12 is a function which is related to the latency counting. The system receives a command in sync with $CLK_{REF}$, thereby initiating the beginning of the latency count. The delay between receiving the command and its proper interpretation is $t_1$. Because $t_1$ and $t_2$ are known, it is possible to predict a digital shift of at least n for a given $T_{REF}$ by calculating equation (1). An example for detecting a digital latency shift by 1 can be realized by $t_1+t_2>=T_{REF}$.

Figure 13:
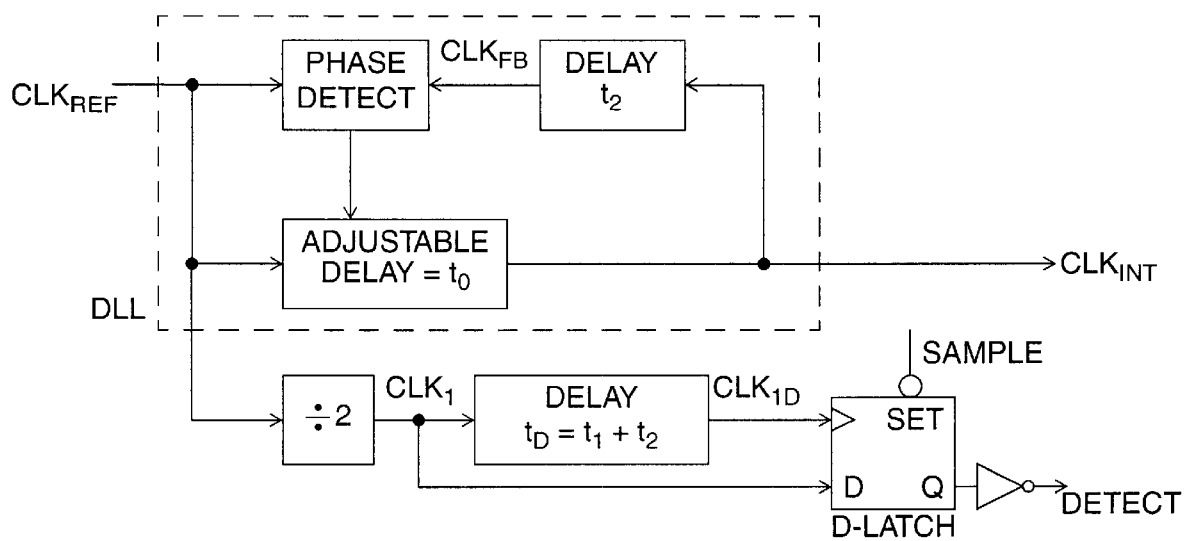
FIG. 13 shows a circuit for comparing $t_1+t_2$ to $T_{REF}$, according to the invention.

FIG. 13 shows the embodiment of a circuit that compares ($t_1+t_2$) $_{to\ TREF}$ to check if $t_1+t_2>=T_{REF}$. The divide-by-2 circuit generates a clock signal $CLK_1$ having half the frequency of $CLK_{REF}$ at a 50% duty cycle. Thus, $CLK_1$ will have high and low pulse widths equal to $T_{REF}$. $CLK_{1D}$ is a delayed version of $CLK_1$ by a time delay of $t_D=t_1+t_2$. To ensure tracking the process, the voltage and the temperature, the delay should be generated from identical copies of the circuits having the same parasitic elements which made up the original $t_1$ and $t_2$ delays.

Figure 14:
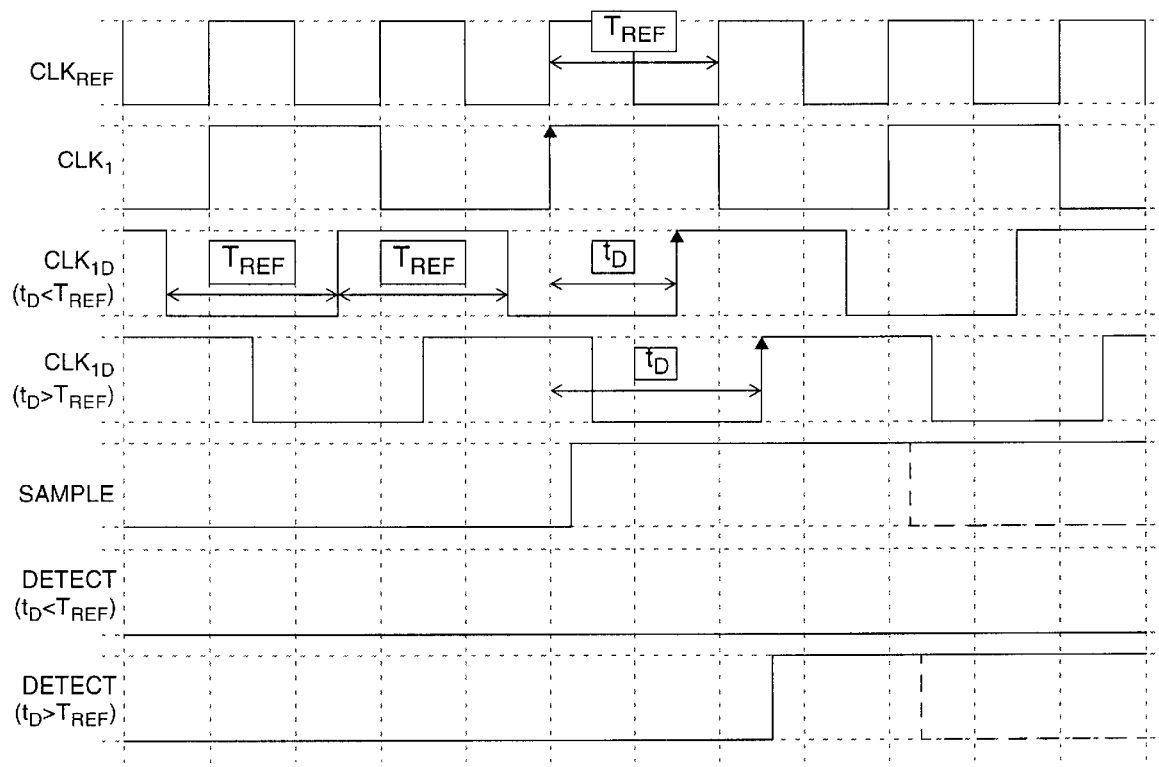
FIG. 14 illustrates the operation of the circuit shown in FIG. 13.

FIG. 14 illustrates the operation of the circuit of FIG. 13. While at 0, the SAMPLE signal holds the output Q of the D-LATCH at 1. Once DLL locks, SAMPLE is released to the high state. At the next positive edge of $CLK_{1D}$, $CLK_1$ is latched. As long as $t_D<T_{REF}$, DETECT will remain at 0. If $t_D>T_{REF}$ and $t_D<2T_{REF}$, DETECT will be latched at a high, as shown. The SAMPLE signal remains at high to allow a continuous sampling. Alternatively, it can be pulsed as shown by the dashed lines so that a predetermined number of samples can be taken. A sample of one of these is shown in the figure. A further study of FIG. 14 reveals that the signal DETECT will indicate a digital shift for the following condition:

$$((2k-1)T_{REF})<t_D<(2k\ T_{REF}),$$

wherein k is an integer greater than or equal to 1. In other words, the digital shifts which can be detected are n=1,3,5,7, . . .

Figure 15:
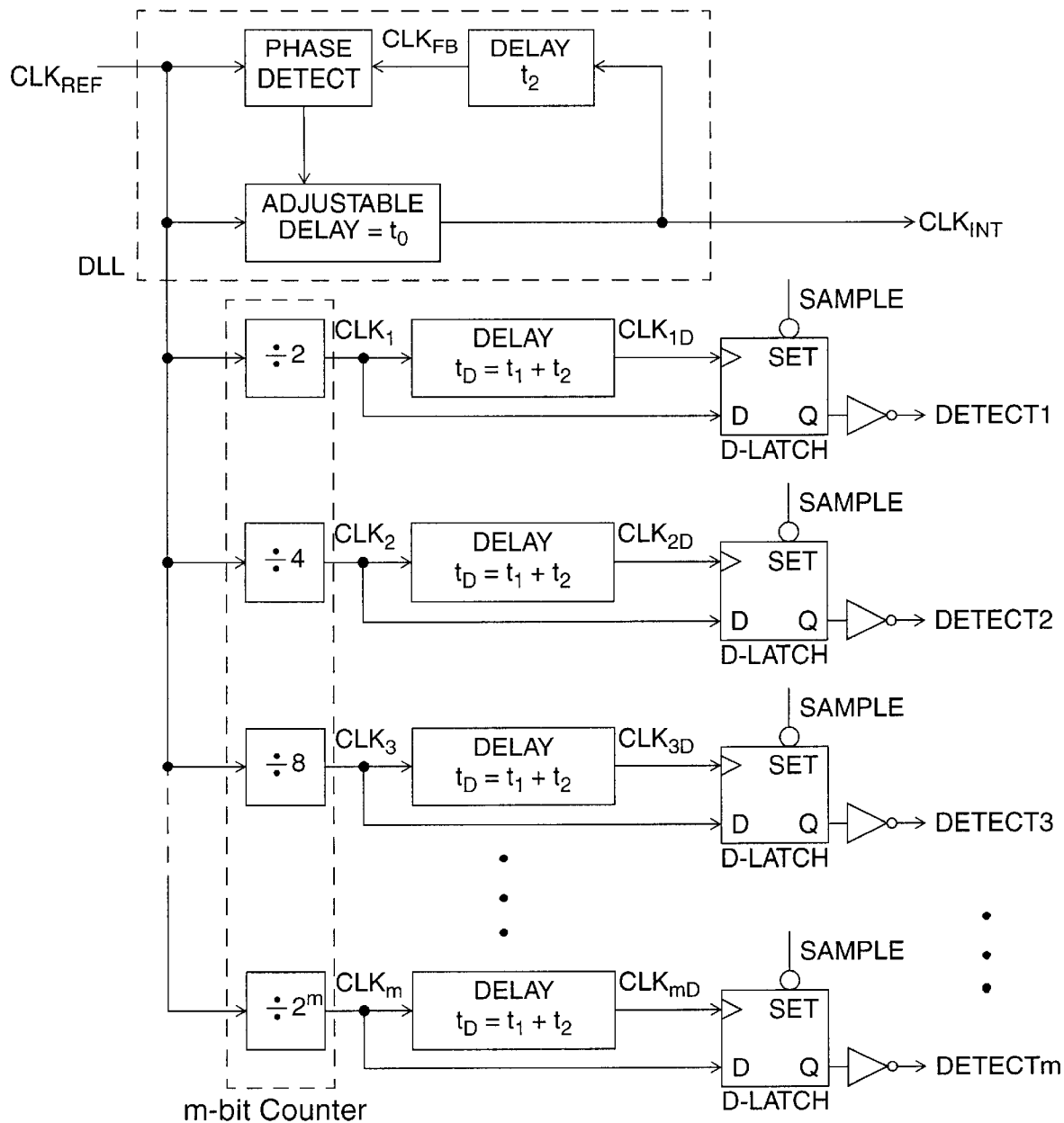
FIG. 15 shows a circuit used to detect multiple digital shifts, according to the invention.

FIG. 15 shows a block diagram of a circuit used for detecting multiple digital shifts. The circuit surrounded by the dashed box is merely an m-bit counter (comprising of a plurality of frequency divide circuits) which is clocked by $CLK_{REF}$. The outputs of the counter are delayed and fed into D-latches, as shown. In this configuration, DETECTi signals will indicate the following digital shifts:

$$(2i-1)(2k-1)T_{REF}<t_D<(2i-1)(2k\ T_{REF}),$$

wherein i and k are integers greater than or equal to 1.

Table 1 shows the digital shifts detected by each signal DETECTi or, more particularly, the digital shift n which makes DETECTi switch to high. The signals DETECTi form a binary vector DETECTi, i.e., DETECT$_3$, DETECT$_2$, DETECT$_1$, which value equals the number of digital shifts present. For example, a vector (0, 0, . . . , 1, 1, 0) indicates a digital shift of 6.

Figure 16:
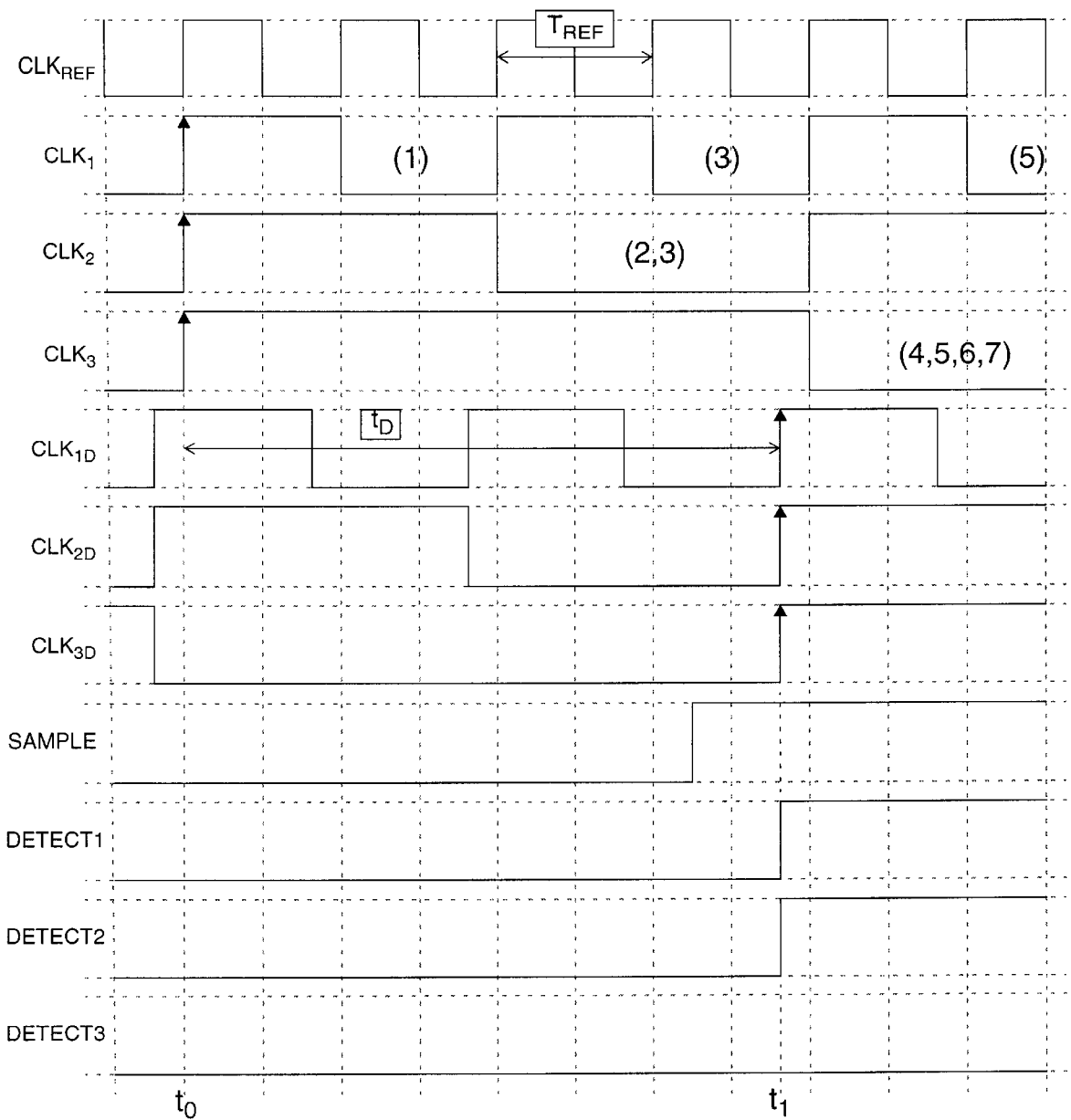
FIG. 16 illustrates the operation of the circuit shown in FIG. 15 for a 3-bit counter and a digital shift of 3.
Figure 17:
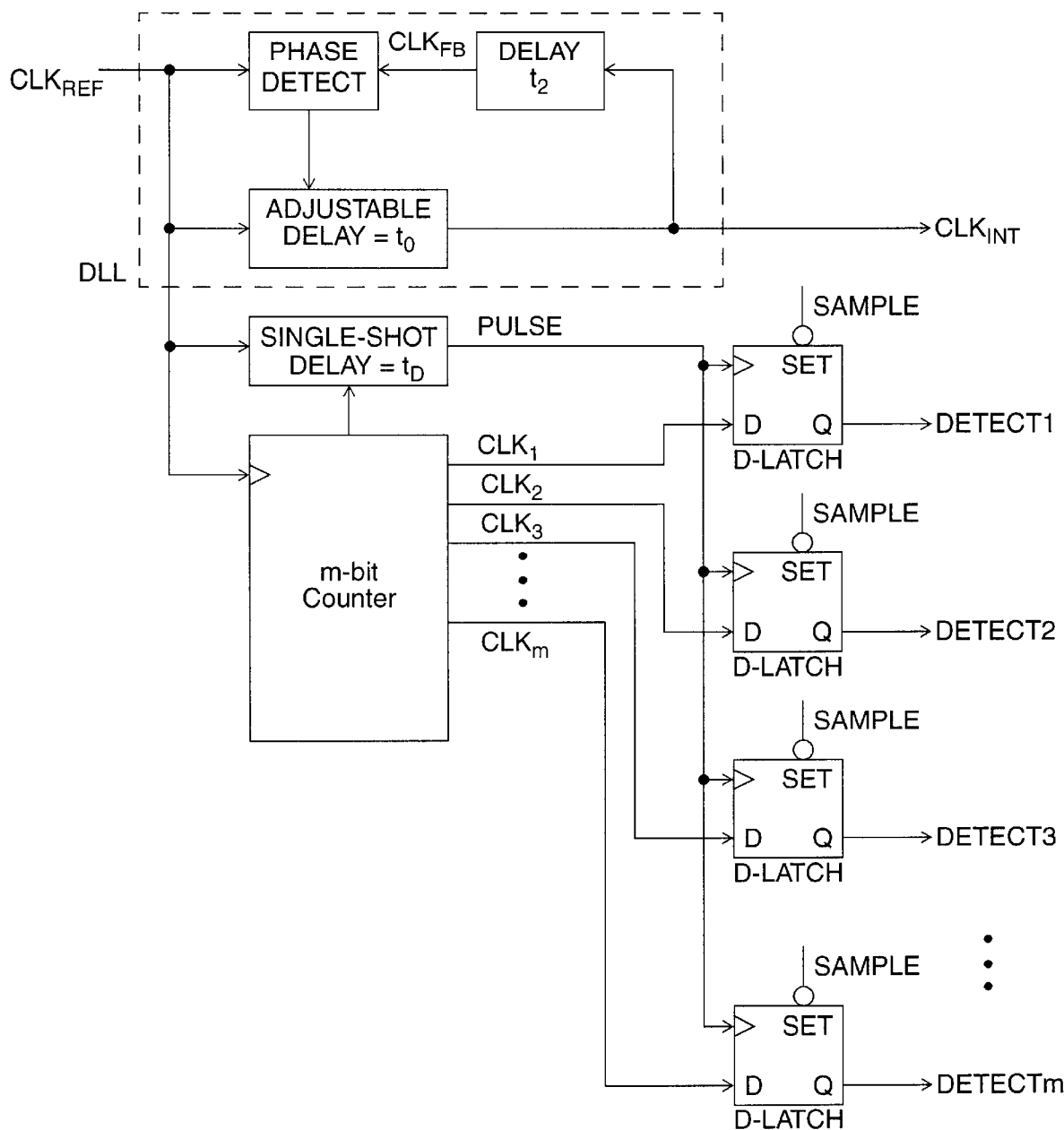
FIG. 17 shows another embodiment of a circuit for detecting digital shifts, in accordance with the invention.

FIG. 16 illustrates the operation of the circuit shown in FIG. 15 applicable to a 3-bit counter and a digital shift of 3. Herein, both the counter and detection circuit are shown in negative logic (i.e., a high state representing the binary value 0 and a low state representing the binary value 1). Thus, the counter starts counting from 0 at $t_0$. When the delayed counter reaches 0 at $t_1$, the current value of the non-delayed counter is latched into the D-latches. The binary value at the DETECTi outputs equals the number of digital shifts n that are present. Here again, SAMPLE remains at high for a continuous sampling. Using this method, the maximum number of digital shifts which can be detected is 2m. A simplified embodiment is shown in FIG. 17. (It is considered simplified since multiple copies of delay elements $t_D$ are not required). In this embodiment, a single-shot circuit creates a pulse when the counter value reaches 0. This pulse is delayed by $t_D$.

Figure 18:
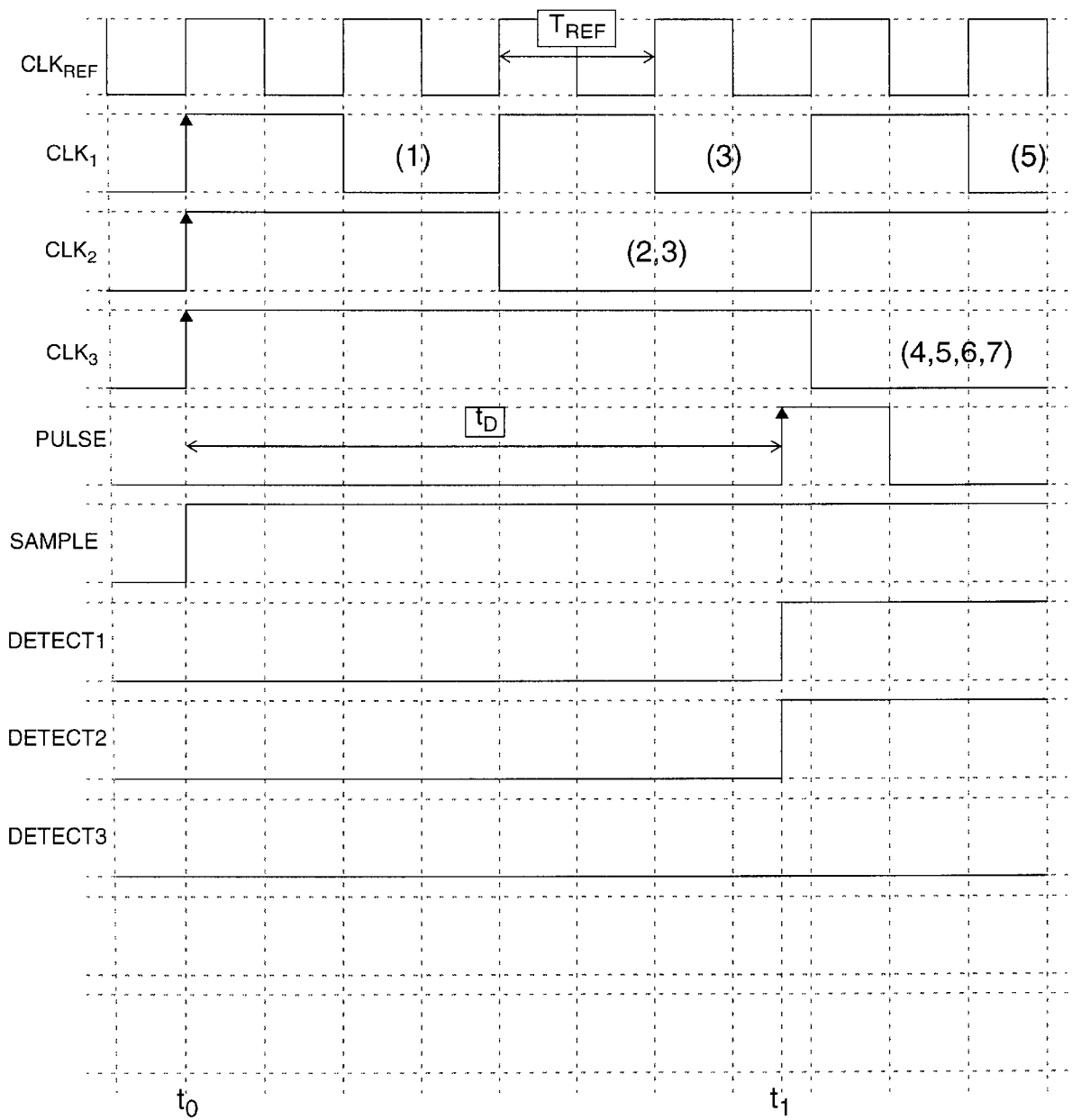
FIG. 18 illustrates the timing operation of the circuit shown in FIG. 17.

FIG. 18 illustrates the timing operation of the circuit of FIG. 17. At $t_0$, the count=0 which generates the delayed PULSE signal. When PULSE makes a transition from low to high, the DETECT vector is latched and the binary value is equal to the number of digital shifts.

TABLE 1

| I | DIGITAL SHIFTS (n) |
|---|---|
| 1 | 1, 3, 5, 7, 9, . . . |
| 2 | 2, 3, 6, 7, 10, 11, . . . |
| 3 | 4, 5, 6, 7, 12, 13, 14, 15, . . . |
| . | . |
| . | . |
| . | . |
| i | (2i − 1)(2k − 1) + (0, . . ., 2i − 1) for k = 1, 2, 3, . . ., 00 and i = 1, 2, . . ., m |

It is also possible to reverse the dependence of the PULSE signal and the condition counter=0 in the circuit shown in FIG. 17. A signal could be provided to initiate the delayed PULSE signal and this signal could be used to reset the counter to 0. The SAMPLE signal is one possibility of using it as the initial signal.

Figure 19:
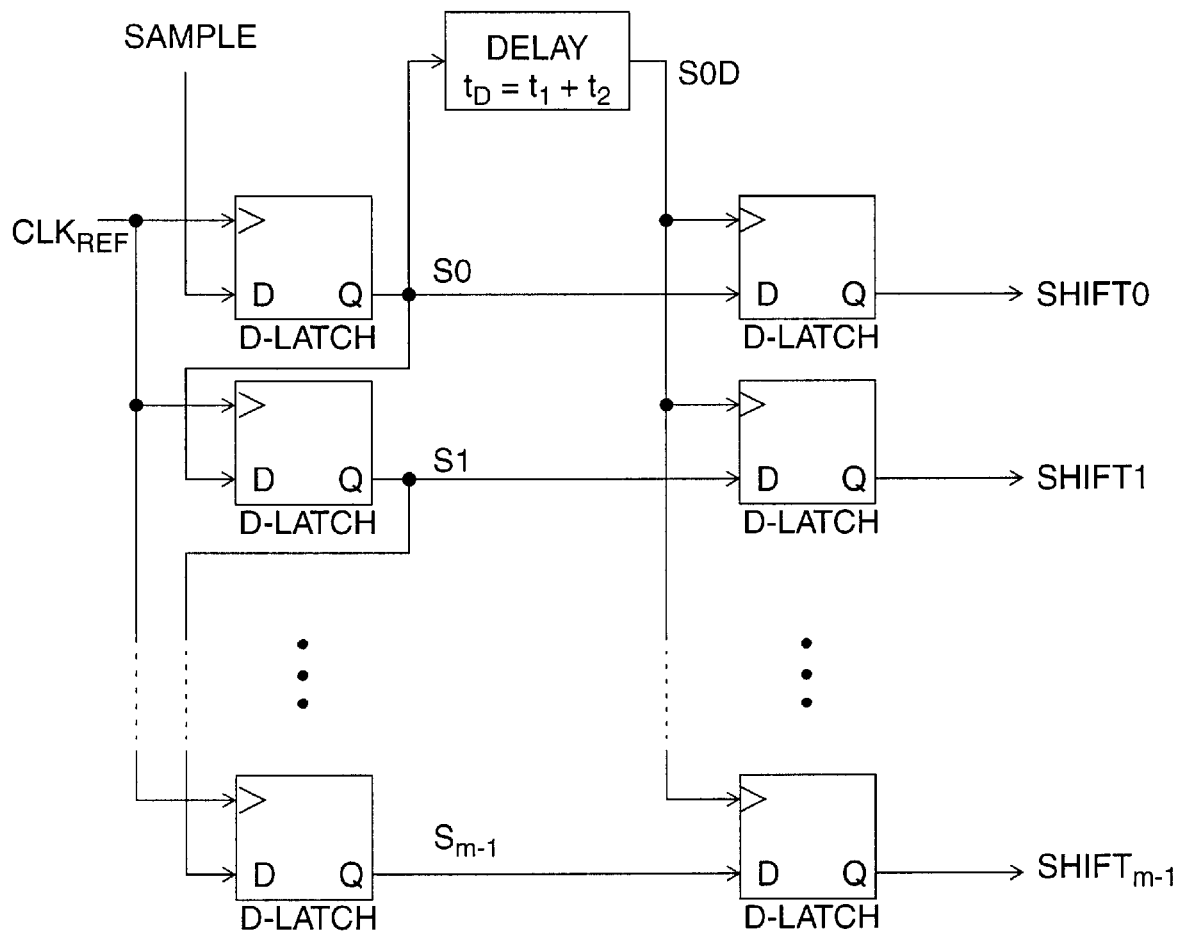
FIG. 19 shows yet another embodiment of a multiple digital shift detector, accordance with the invention.

FIG. 19 shows another embodiment of a multiple digital shift detector. In this embodiment, a shift register made up of edge-triggered D-latches is used to count periods of the CLK$_{REF}$ signal in lieu of the counter.

Figure 20:
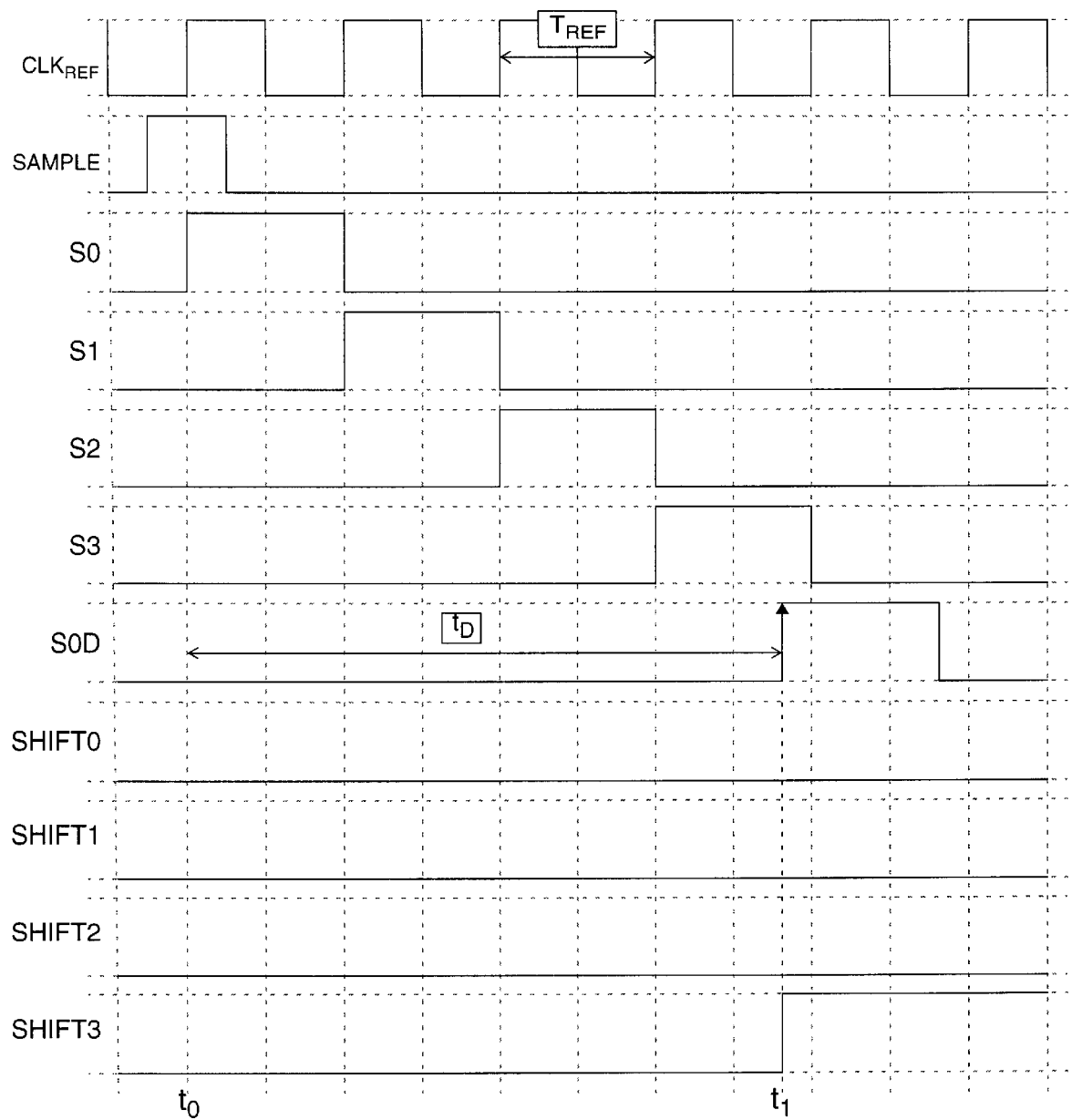
FIG. 20 shows the operation of the circuit shown in FIG. 19 for a digital shift of 3.

FIG. 20 depicts the operation of the circuit shown in FIG. 19 for a digital shift=3. The signal SAMPLE initiates an S0 pulse having a width of 1 cycle and in sync with CLK$_{REF}$. This pulse is subsequently shifted to the next stage with each positive edge of CLK$_{REF}$. S0D is a delayed version of S0. As in prior embodiments, the delay $t_D$ is set equal $t_1+t_2$ and should match the source of the original delay as closely as possible. The positive edge of S0D latches the signals S0 through Sm−1 in a second row of D-latches. The output of these latches are SHIFT$_0$ through SHIFT$_{m−1}$. These signals directly give a decoded value equal to the number of digital shifts. If SHIFT$_0$ is at high, there was no digital shift; if SHIFT$_1$ is high, there is a digital shift of 1, etc. The maximum number of digital shifts which can be detected is m−1. For simplicity sake, the preceding discussion assumes an ideal operation of the digital circuits. In reality, non-ideal conditions may exist that make digital shift detection ambiguous in some regions of operation. This is particularly true when $t_D > n/T_{REF}$. When this condition occurs, a digital shift may be registered by the detector when no digital shift is present. Conversely, a digital shift is not registered when the digital shift occurs. This happens because $t_1+t_2$ (which is required for calculating $t_D$) is merely a copy of the actual values that give rise to the digital shift. If these copies differ slightly, contradictory outcomes may result. Also, at this point the counter circuitry is switching with some finite transition time and, therefore, an erroneous value may be latched in. In order to eliminate this problem, it is desired to detect the region of ambiguity between two digital shifts and force both the detector and the actual circuitry to move to a higher digital shift.

Figure 21:
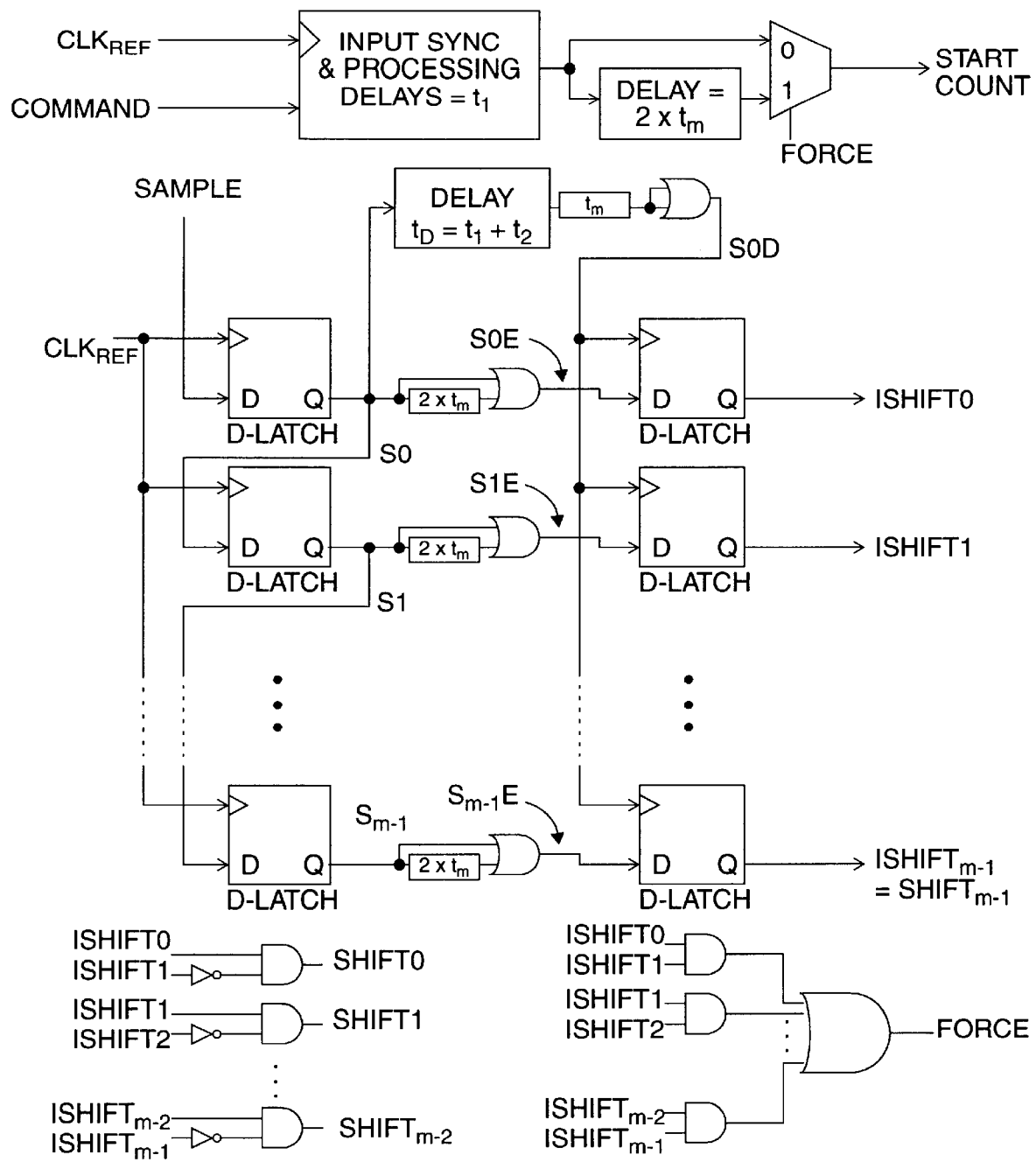
FIG. 21 shows a circuit representing an extension of the circuit shown in FIG. 19.
Figure 22:
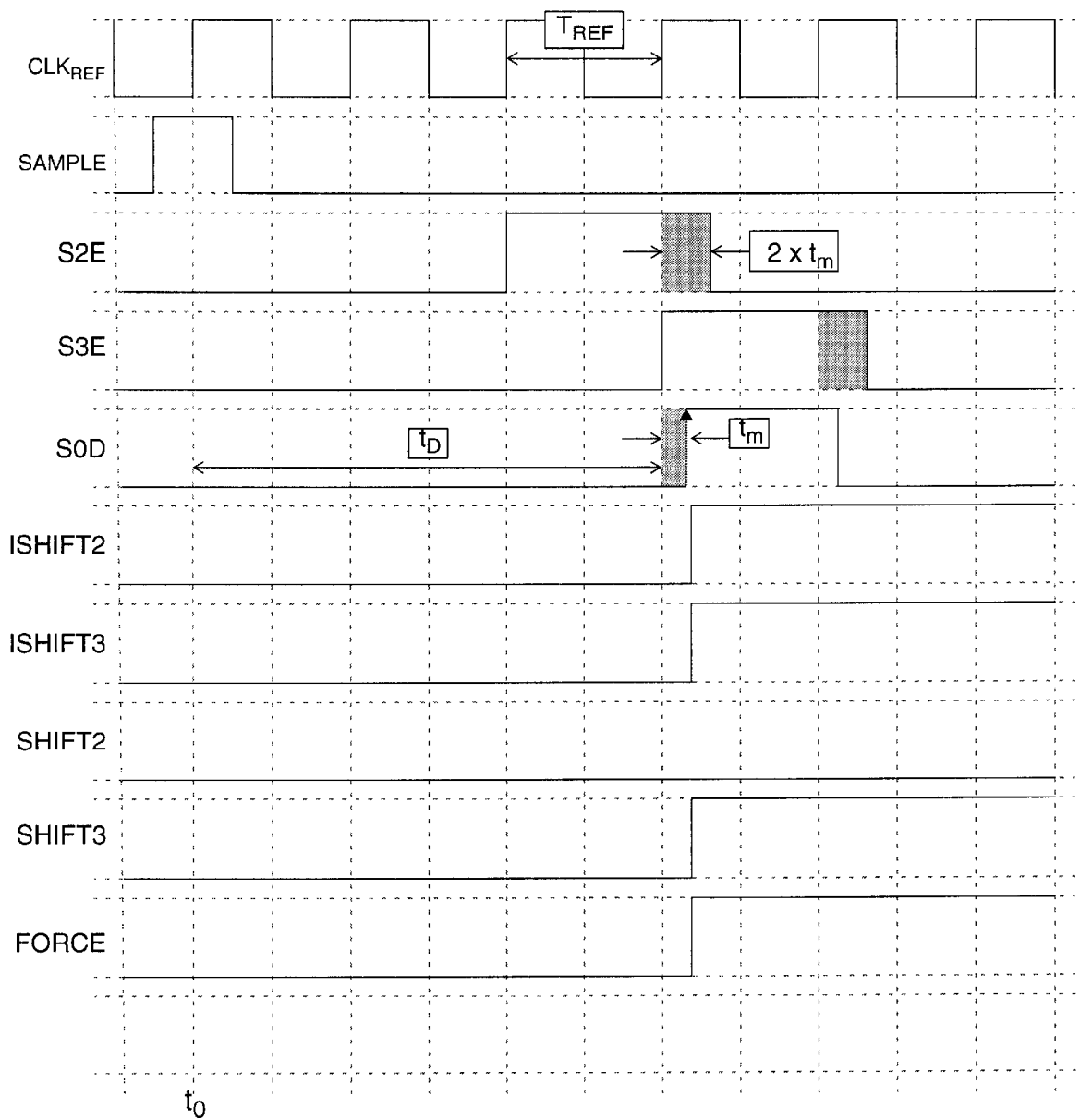
FIG. 22 illustrates a timing diagram displaying overlapping regions between stages.

FIG. 21 shows a circuit that accomplishes the aforementioned task, and which is an extension of FIG. 19. By extending the pulse width for each stage in the shift register to $T_{REF}+2t_m$, it creates overlapping regions between the stages result, as shown by the shaded areas in FIG. 22. The value of $t_m$ must be less than one-fourth (the minimum $T_{REF}$) and greater than $t_{ERR}$, which is the aggregate of all the errors in the critical path due to skew, to circuit mismatches and to other variations. As shown in FIG. 22, if two signals ISHIFT are concurrently at high, they will reside within the region of ambiguity. When this condition exists, it becomes advantageous to force the circuit operation out of the region of ambiguity, which is accomplished by way of signal FORCE. This signal causes $2t_m$ to be added to the actual $t_1$. This example is also shown in FIG. 22 for the case of latency counting. Mathematically, the ambiguous region arises when $$nT_{REF}-t_m<(t_1+t_2)<nT_{REF}+t_m.$$

Forcing the operation out of the ambiguous region as described above results in an operation within the safe region defined by $$(nT_{REF}+t_m)<(t_1+t_2+2t_m)<(n+1)T_{REF}-t_m.$$

This last equation assumes that $t_m<¼$, the minimum $T_{REF}$.

While this invention has been described in terms of several embodiments, those skilled in the art will recognize that changes and modifications may be made in the particular embodiments of the invention described which are within the full intended scope of the invention as defined by the appended claims.

What is claimed is:

1. A method of providing an electric system with a frequency that extends from a low frequency to a high frequency, the method comprising the steps of:

outputting data to a bus in synchronism with a first clock signal, wherein outputting said data is controlled by a prescheduled data output command and by a predetermined data output latency;

receiving data from said bus in synchronism with said first clock signal, wherein receiving said data is controlled by a prescheduled data input command and by a predetermined data input latency; and providing a digital latency shift detection means comprising:

a clock compensation circuit which generates a compensated clock signal with respect to a first clock signal by the first time delay ($t_1$) defined by a first delay element;

a frequency divider circuit responsible to said first clock signal to generate a second clock signal having a frequency which is one-half the frequency of said first clock signal;

a second delay element coupled to said frequency divider, and generating a third clock signal which is delayed by said first time delay ($t_1$) plus a second time delay ($t_2$);

a detection circuit to detect when a leading edge transition of said third clock signal occurs before a trailing edge transition of said second clock signal; and rescheduling in synchronism with said first clock signal at least one of said prescheduled data output commands and said predetermined data output latency, one of said prescheduled data input command and said predetermined data input latency, wherein by back-feeding said data output latency offset and said data input latency offset detected by said digital shift detection means to said scheduling means, said driving means and said receiving means communicate data correctly.

2. The method as recited in claim 1 further comprising the step of providing an analog compensation means to at least one of said scheduled output commands, to said scheduled output latency, to said scheduled input command and to said scheduled input latency.

3. A digital latency shift detection means comprising:

a clock compensation circuit generating a compensated clock signal with respect to a first clock signal by a first delay time (t) defined by a first delay element;

a frequency divider circuit coupling said clock for generating a second clock signal having a frequency one-half the frequency of said clock;

a second delay element coupled to said second clock signal and generating a third clock signal which is delayed by said first delay time ($t_1$) plus a second delay time ($t_2$); and a detection circuit for detecting when a leading edge transition of said third clock signal occurs before a trailing edge transition of said second clock signal, thereby detecting a digital latency shift of odd cycles due to said clock compensation.

4. The digital latency shift detection means as recited in claim 3, wherein said compensation circuit is a delayed-lock-loop (DLL) circuit, and wherein said first delay time ($t_1$) is the output of a logic delay of an electrical system.

5. The digital latency shift detection means as recited in claim 4, wherein said second delay time ($t_2$) is an event recognition delay of said electric system.

6. The digital latency shift detection means as recited in claim 3, wherein said detection circuit is a delayed-latch circuit (D-LATCH) having a clock port responsive to said third clock signal, and input port (D) responsive to said second clock signal, and an output port (Q) responsive to the outcome of said digital latency shift of odd cycles.

7. The digital latency shift detection means: as recited in claim 6, wherein said D-LATCH circuit further comprises a control signal (SAMPLE) enabling a digital shift detection once said delayed-lock-loop (DLL) circuit locks.

8. A digital latency shift detection means as recited in claim 7, wherein said actual latency measurement means is a built-in self tester (BIST).

9. A digital latency shift detection means comprising:

a clock compensation circuit that generates a compensated clock signal with respect to a first clock signal by a first delay time ($t_1$) defined by a first delay element;

a plurality (m) of frequency divider circuits, each being coupled to said first clock signal for generating second clock signals having a frequency equal to $½^m$ frequency of said clock;

a plurality (m) of second delay elements, each of said delay elements being coupled to each of said corresponding second clock signals, generating third clock signals that are delayed by said the first delay time ($t_1$) plus a second delay time ($t_2$); and a plurality (m) of detection circuits, each of said detection circuits generating a corresponding detect signal output (DETECTi), wherein i is an integer ranging from 1 to m, and wherein when a leading edge transition of said third clock signal occurs before a trailing edge transition of a corresponding one of said second clock signals, a multiple digital shift condition up to m cycles is determined by the result of said detection (DETECTi).

10. The digital latency shift detection means as recited in claim 9, wherein said plurality of frequency dividers are m bit counters.

11. A digital latency shift detection means comprising:

a clock compensation circuit generating a compensated clock with respect to a first clock signal by a first delay time ($t_1$) defined by a first delay element;

a first plurality (m) of edge-triggered delay latch circuits (D-LATCHi), wherein i is an integer ranging from 0 to m−1, each of said D-LATCHi's having a corresponding input port Di and corresponding output port Qi generating corresponding output signals Si synchronized to said first clock signal, wherein edge-triggered delay latch D-LATCH$_0$ is responsive to an enable signal to initiate a digital latency shift detection, and output signal S0 is coupled to a second delay element to generate a second clock signal which is delayed by said first delay time ($t_1$) plus a second delay time ($t_2$), and output signal Si (i>0) is coupled to the Di+1 port to generate output signal Si+1 signal; and a second plurality of edge-triggered delay latch circuits (D-LATCHj), wherein j is integer ranging from 0 to m−1, each of said D-LATCHj's having a corresponding input ports Dj and the corresponding output ports Qj, a corresponding input port Dj coupled to output signal Si, and a corresponding output port Qj generating a detection result signal SHIFTj synchronized to said second clock signal, wherein a shift condition of m cycles is determined by the outcome of said detection result signal SHIFTj.

12. The digital latency shift detection means as recited in claim 11 further comprising a third delay element ($T_3$) for extending the delay of said second delay element by a delay time ($t_m$) to enable detection within a region defined by:

$$(nT_{REF}+t_m)<(t_1+t_2+2t_m)<(n+1)T_{REF}-t_m$$

wherein $T_{REF}$ corresponds to the first clock cycle time, and n is any integer number.

* * * * *